United States Patent [19]

Stiffler

[11] Patent Number: 4,736,376

[45] Date of Patent: Apr. 5, 1988

[54] SELF-CHECKING ERROR CORRECTING ENCODER/DECODER

[75] Inventor: Jack J. Stiffler, Hopkinton, Mass.

[73] Assignee: Sequoia Systems, Inc., Marlborough, Mass.

[21] Appl. No.: 791,321

[22] Filed: Oct. 25, 1985

[51] Int. Cl.[4] .............................................. G06F 11/10
[52] U.S. Cl. ........................................... 371/37; 371/3
[58] Field of Search ....................... 371/37, 39, 40, 38, 371/3

[56] References Cited

U.S. PATENT DOCUMENTS 4,276,646  6/1981  Haggard et al. ..................... 371/37
4,397,022  8/1983  Weng et al. ......................... 371/37
4,553,237 11/1985  Nakamura .......................... 371/37

OTHER PUBLICATIONS

Golla et al., Self-Checking CRC Generator, IBM Technical Disclosure Bulletin, vol. 15, No. 6, Nov. 1972, p. 1905.

Primary Examiner—Charles E. Atkinson

Attorney, Agent, or Firm—Wolf, Greenfield & Sacks

[57] ABSTRACT

Encoding/decoding circuitry which processes data and both corrects single errors and detects multiple errors is disclosed. The circuitry is both fail-safe and self-checking in that no internal device failure can alter data without producing improperly encoded outputs and all failures quickly reveal themselves through normal usage even if they do not actually cause any data to be modified. The circuitry can be configured in two identical halves with each half operating on one half of the data so that the circuitry can be advantageously constructed with large scale integrated circuits. Error-detecting information in the form of a syndrome produced by each circuit half is combined with similar syndrome information produced by the other circuit half. The combined syndrome information is then decoded to generate error correction information which is used to modify the data bit outputs to correct detected errors. A failure in either circuit half modifies the combined syndrome information in such a way that the modification can either be detected or else causes no erroneous data bit modification.

28 Claims, 10 Drawing Sheets

Fig. 1

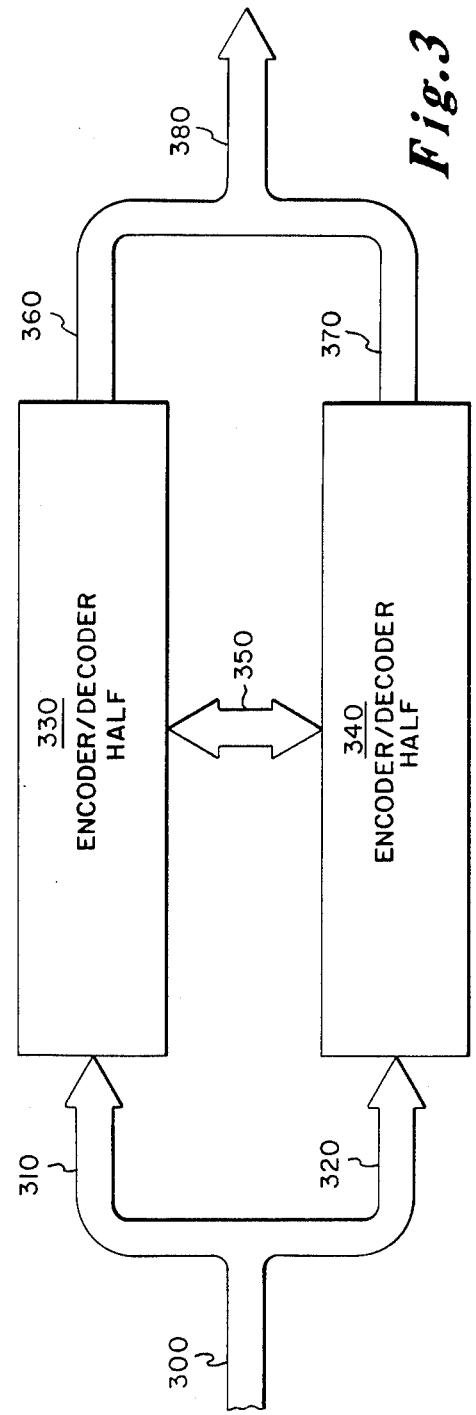

Fig. 2A

SELF-CHECKING ERROR CORRECTING ENCODER/DECODER

FIELD OF THE INVENTION

This invention relates to data transmission and storage circuits and, in particular, to encoding and decoding circuits which encode data to reduce errors.

BACKGROUND OF THE INVENTION

In high-reliability data processing systems it is necessary to have circuitry which checks data that has been transmitted between system units or which has been stored in system memories and detects errors which may have been introduced during the transmission or storage operations. Error detection and correction is especially necessary in systems in which data transmission or storage is performed at high speeds because such systems are more prone to disturbances by noise and other erroneous signals.

Accordingly, many prior art arrangements have been developed to protect data stored in memories and data which is transmitted between data processing circuits. The simplest of these systems calculate the "parity" of the data. Generally the parity of the data is related to the number of logical "1"s in the data word. A data word with an even number of ones is said to have "even" parity, while a data word with an odd number of ones is said to have "odd" parity. A parity bit representing the parity of the data word (usually the parity bit is a logical "0" if the parity is even and a logical "1" if the parity is odd) is calculated from the data bits and appended to the data word prior to transmitting or storing the data.

After the data has been retrieved from memory or received over the transmission channel, the parity is again calculated from the received data bits and compared to the retrieved or received parity bit. If the two are not equal, then it is assumed an error has occurred and the data can be re-transmitted or re-retrieved. A problem with this simple system is that it cannot indicate in which data bit (or bits) the error occurred, so that the entire data word must be re-transmitted rather than just the erroneous bit or bits. Accordingly, the system is slow.

Other, more sophisticated systems have been developed which are capable of detecting errors in particular bits and, in some cases correcting the errors without requiring re-transmission. These protection arrangements generally operate by appending to the data a multiple-bit parity code word which is calculated from the values of the data bits. One common method of calculating the parity code word bits is to exclusive-OR the data values in selected bit positions to generate one bit of the parity code word. Thus the value of a parity code word bit will be the parity (number of logical "1"s) of the selected data bit positions. Both the data and the appended parity code word are then stored or transmitted.

After the data has been received over the transmission channel or has been retrieved from memory, the code word bits are again calculated from the retrieved data bits and compared against the retrieved code word bits. In order to do the comparison, the re-calculated code word bits and the retrieved code word bits are combined in predetermined combinations called "syndromes". The values of the syndromes are then decoded (compared to predetermined patterns) to detect whether an error has occurred. In some systems the syndromes are further processed to generate error correction information which is then used to correct erroneous data bits.

Many prior art error-detecting and correcting techniques have been devised which are capable of both detecting and correcting errors which affect only one data bit. These techniques have met with varying degrees of success, depending on the application in which a particular technique is used. For example, when an error-detecting technique that is capable of detecting single errors is used with random access memories that are implemented with one-bit-wide memory elements, a high degree of protection is achieved since the vast majority of faults that occur in this situation are single-bit errors. However, when the same technique is used with a different implementation in which multiple-bit memory elements are used, the degree of protection achieved is significantly less since the probability of multiple simultaneous errors increases.

Prior art techniques are also available which can detect or correct double errors or higher numbers of simultaneous errors. However, the use of syndromes to correct more than one error requires complicated circuitry. Consequently the calculations necessary to generate the syndromes are lengthy and require complex and expensive circuitry. Therefore, there is a need for an error-correcting arrangement which is relatively simple and which can at least detect multiple simultaneous errors.

In high-reliability systems another problem arises because the encoding and decoding circuitry needed to generate the error-correcting codes and to correct detected errors in the retrieved and coded information is itself subject to failure. Although error-correcting encoders and decoders are generally considered to be more reliable than the memories they are protecting they are usually considerably less reliable than the protected memory. That is, the probability that the memory produces an error that is not detectable by the decoder is typically orders of magnitude less than the probability that the decoder itself fails. Since a failed encoding/decoding system which corrects detected errors can obviously alter the data which it is supposed to be coding and thereby introduce errors into the data instead of removing them, prior art systems which generate undetectable errors are unacceptable in high reliability data processing systems.

To ensure that a encoder/decoder cannot fail in such a way that it generates data containing undetectable errors it is necessary that it be both fail safe and self-checking. To be fail safe a circuit must not itself generate undetectable errors. That is, if as a result of the failure the fail-safe circuit erroneously alters one or more data bits that fact will become apparent to a receiver of the erroneous data. A circuit which is self-checking must, in ordinary usage, exercise all of its data paths in such a way that, if it does contain a faulty element, that fault will be exposed. In a high-reliability system, it is necessary that the data detection/correction circuitry be both fail-safe and self-checking.

SUMMARY OF THE INVENTION

The foregoing objects are achieved and the foregoing problems are solved in one illustrative embodiment of the invention in which an encoder/decoder circuit is constructed in two identical halves. Each half of the circuit receives one half of the total data information, detects errors in that information and corrects single bit errors in the data. The circuit half provides corrected bit outputs and a signal which indicates whether the data is valid or not.

In particular, each circuit half generates "half syndromes" based on parity code signals generated from the data available to it and parity code signals received from the other decoder half. The error-correcting algorithm and the circuit implementation is chosen so that a failure in either circuit half which causes its parity code signals to be in error cannot force the half syndrome into a pattern which, in turn, causes an erroneous data modification without also signalling that the data is invalid.

More specifically, the parity check code used in each circuit half is single-error detecting. That is, any single-bit-error produces a unique set of syndromes or parity check relationships. Since the syndromes for each particular error are different from the syndrome resulting from another single bit error, the syndromes can be used to generate error correction information.

In addition, if each data word is broken into two halves with one half containing the least significant bits of each byte and the other half containing the most significant bits of each byte, the inventive parity check code relationships are symmetrical with regard to the least significant and most significant data word halves. The parity check code also detects all multiple errors affecting data bits separated from each other by multiples of eight bit positions. Due to these two facts, the circuitry which generates and decodes the parity check relationships can be split into two identical halves with each half circuit generating and decoding half of the parity check relationships. Furthermore, the parity relationships generated in each half circuit as intermediate variables in the encoding and decoding process can be combined to produce byte parity relationships that can be used to protect data sent from the half circuit to external receivers or to check data received from external sources.

BRIEF DESCRIPTION OF THE DRAWINGS

FIG. 1 shows a parity check matrix defining the parity check relationships used with the inventive circuitry.

FIGS. 2 and 2A show a half matrix of the parity check matrix shown in FIG. 1 which defined the parity check relationships used in each half circuit.

FIG. 3 is a block schematic diagram of encoder/decoder circuitry constructed in accordance with the invention.

DETAILED DESCRIPTION OF THE PREFERRED EMBODIMENT

Figure 4:
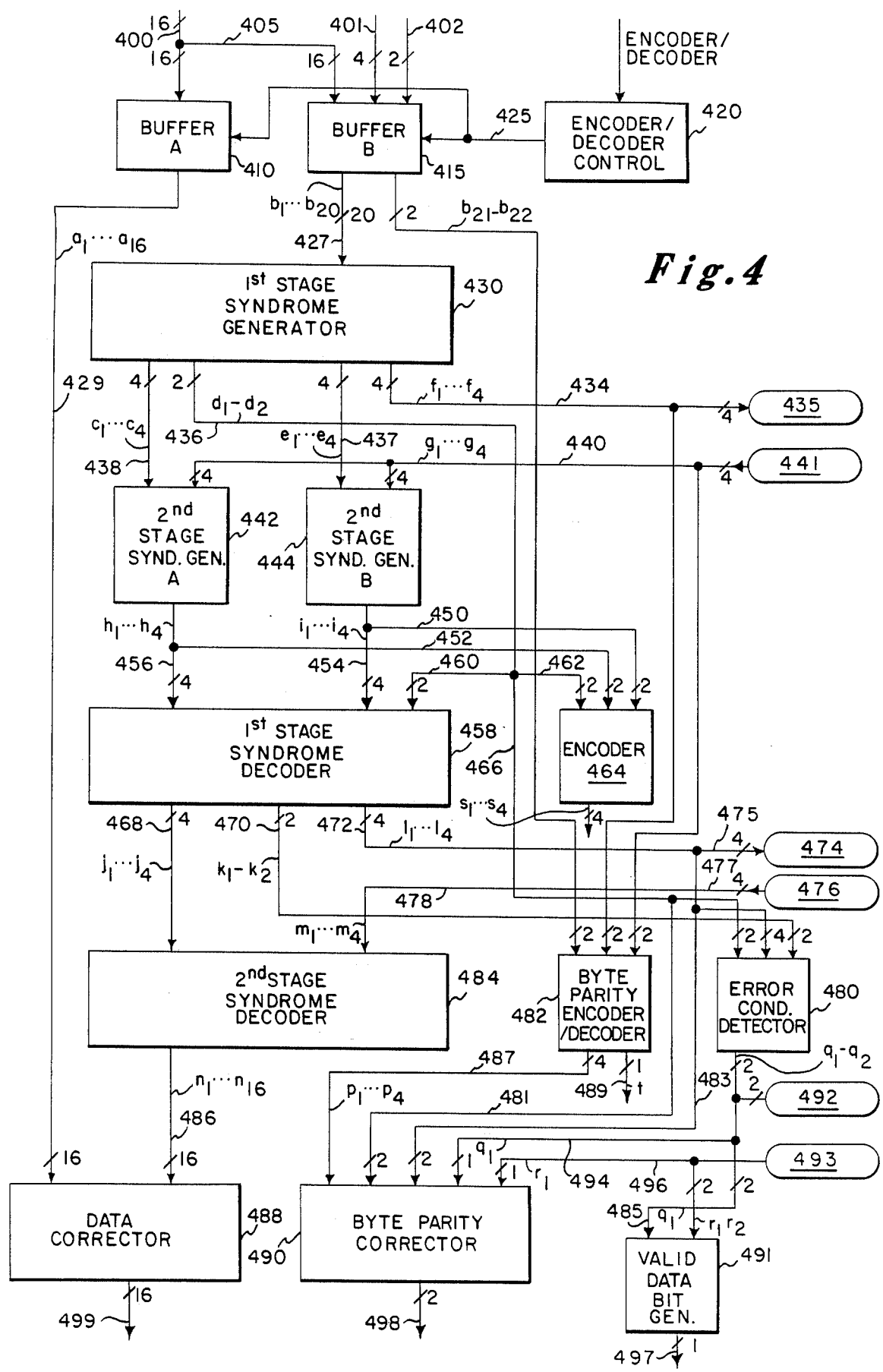
FIG. 4 is a more detailed block schematic diagram of each half of the encoder/decoder circuitry.

The inventive encoder/decoder circuitry is based on a set of parity check relationships which allows the encoding and decoding circuits to be split into two halves while maintaining fail-safe and self-checking properties. The particular parity check relationships used to implement the inventive encoder/decoder are defined by the parity check matrix shown in FIG. 1. Each row of this matrix shows the data bits comprising one 32-bit data word and a corresponding 8-bit parity word. The data words are arranged with the least significant bit located at the right and the most significant bit located at the left. The corresponding parity word is located to the right of the data word with the least significant bit at the right and the most significant bit at the left.

Each row of the matrix represents one parity check relationship. For each row, the data and parity bit positions marked by "1"s are constrained to have an even number of logical "1"s. Thus, for example, for row 1, bit position 7 of the parity check word will be a logical "1" if data bit positions 4, 5, 6, 12, 13, 14, 20, 21, 22, 24, 25, 26, 27, 28, 29 and 30 contain an odd number of logical "1"s. Otherwise, bit position 7 of the parity check word will be "0". Bit positions which are denoted with a "0" do not enter into the parity relationship and may be either logical "1"s or "0"s without affecting the relationship.

Similarly, row 2 of the matrix represents another parity check relationship in which bit position 6 of the parity check word will be a logical "1" if data bit positions 4, 5, 7, 12, 13, 15, 16, 17, 18, 19, 20, 21, 23, 28, 29 and 31 have an odd number of logical "1"s, otherwise, bit position 6 of the parity word will be a logical "0".

Figure 1:
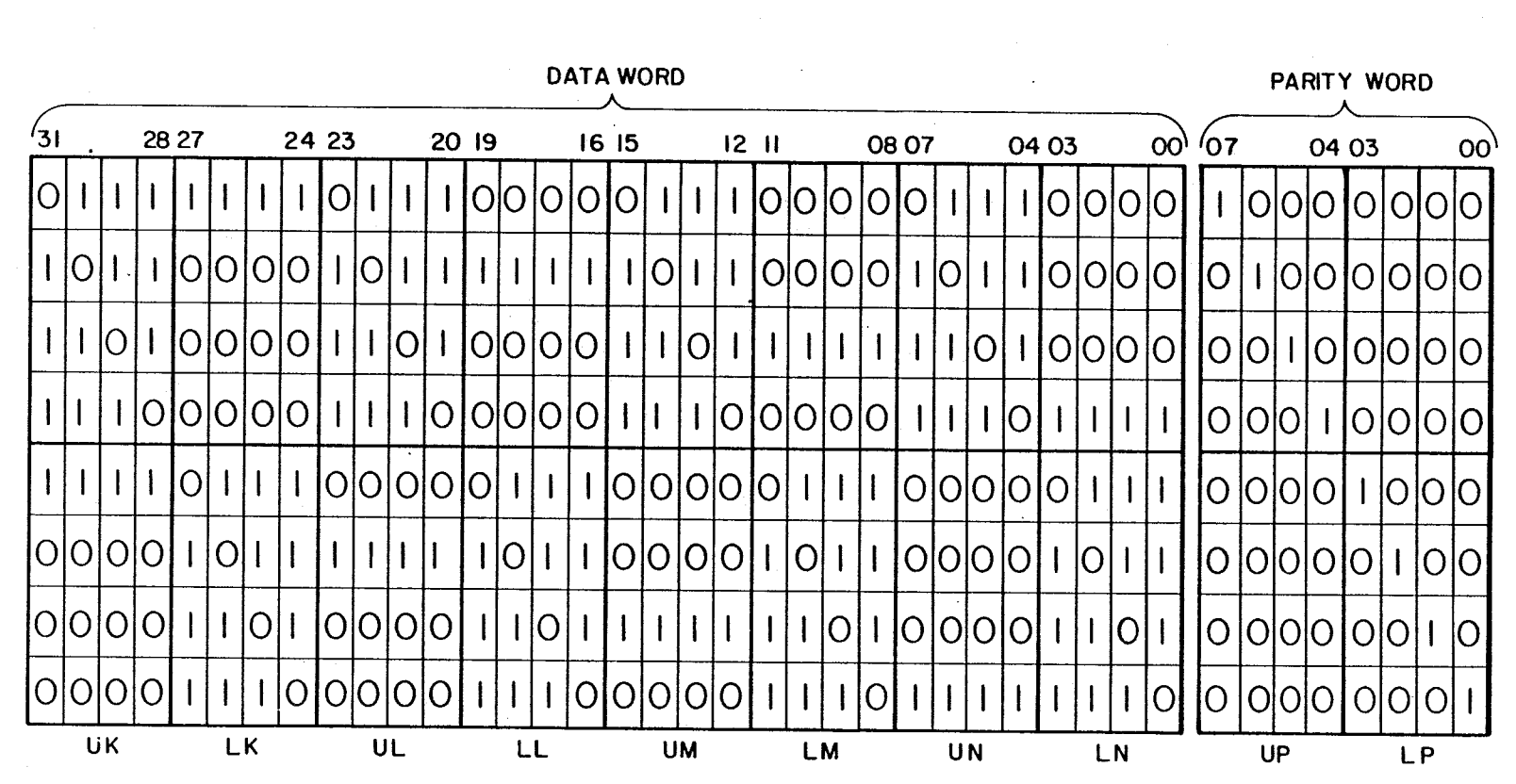

The set of parity check relationships illustrated in the matrix of FIG. 1 has several important characteristics. First, it is single error detecting—all data words containing an error in a single bit will be detected—and, simultaneously, the code is double-error detecting. This characteristic is a consequence of two facts (a) that each column of the matrix is different from all other columns and (b) the term-by-term, modulo-2 sum of any pair of columns is distinct from all single columns.

Fact (a) ensures that any single-bit error produces a unique set of parity errors (syndrome). For example, an error in data bit position 24 will cause parity errors in the parity relationships in rows 1, 5, 6 and 7. No error in another bit position will cause parity errors in that set of rows. Therefore a syndrome which consists of correct parity relationships in rows 2–4, and 8 and erroneous relationships in rows 1 and 5–7 indicates an error in data bit position 24.

Fact (b) above ensures that any pair of simultaneous errors results in a syndrome distinguishable from that resulting from any single error.

The ability to correct single errors is not unique and is found in many prior art coding schemes. The inventive code has several additional characteristics which are unique and form the basis of the code's fail-safe and self-checking abilities.

Another important characteristic of the code shown in FIG. 1 is that all multiple errors affecting only data bits confined to a single nyble or affecting only data bits separated from each other by multiples of 8 bit-positions are detectable. For example, the code will detect a multiple error affecting any subset of the bits in data bit positions 6, 14, 22 and 30. These latter characteristics follow from the fact that no term-by-term, modulo-2 sum of any two or more data-bit columns of the FIG. 1 matrix which are either confined to the same nyble or are separated from each other by multiples of 8 is identical to any single column of the matrix.

Two additional important characteristics of the code depicted in the FIG. 1 matrix allow the code to be implemented by circuitry constructed in two identical halves and make the implementation fail-safe and self-checking. One of these characteristics is the fact that the FIG. 1 matrix can be split into two identical half matrices with each half matrix defining four of the eight parity check relationships. In particular the parity relationships are established by exclusive-ORing the selected data bits to form the parity bit. Since the exclusive-OR operation is associative (A XOR (B XOR C)=(A XOR B) XOR C) and commutative (A XOR B=B XOR A), the columns of the FIG. 1 matrix can be rearranged without affecting the error correcting and detecting abilities of the code. In addition, due to the properties of the exclusive-OR operation, the parity relationships can be computed in pieces and later combined to form the complete parity relationship.

When the columns are rearranged, the matrix can be split into two identical halves because the parity check relationships are symmetrical with respect to half data bytes containing the most significant bits and the least significant bits.

The split can be performed as follows: The 32 data-bits are divided into four 8-bit bytes which are arbitrarily assigned the identifiers K, L, M, and N. Each byte is in turn divided into an "upper" half-byte or "nyble" (designated by a "U" containing the most significant bits) and a "lower" half-byte or "nyble" (designated by an "L" containing the least significant bits). Thus there are a total of eight data-bit nybles which are designated by two letters codes: UK, LK; UL, LL; UM, LM; and UN, LN. In addition, the parity word is divided into an upper 4-bit parity nyble (designated as "UP") and a lower 4-bit parity nyble (designated as "LP"). The data nyble designations and the parity nyble designations are shown in FIG. 1.

With the foregoing notation, the parity code half matrices assume the form shown in FIG. 2. In FIG. 2, the designator "X" stands for either "U" or "L" and the designator "Y" is the "complement" of X (that is, if X stands for "U" then Y stands for "L" and the converse). The matrix is symmetrical with respect to the data half-word consisting of the upper half of bytes K,L,M and N (UK, UL, UM and UN) and the lower half-word consisting of the lower half of bytes K,L,M and N (LK, LL, LM and LN). Therefore, a circuit which uses the parity check relationships shown in FIG. 1 can be constructed in two halves—each half computing the four relationships shown in FIG. 2.

Figure 2A:
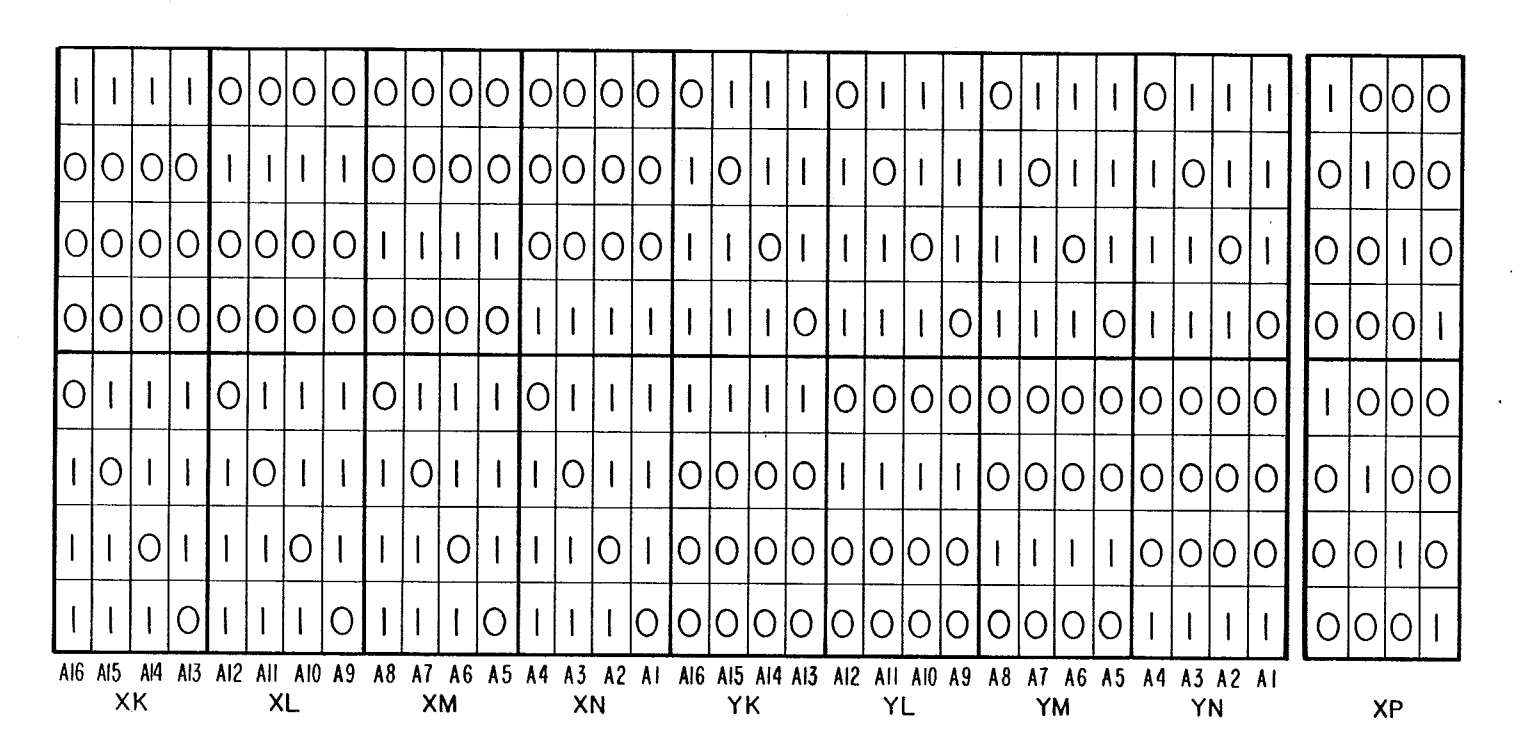

In accordance with the invention, each encoder/decoder circuit half need only compute eight relationships. These include the parity of four data nybles (UK, UL, UM and UN or LK, LM, LL and LM) and four other relationships involving selected bits of the four complementary nybles. Since the matrix is symmetrical, the same relationships must be calculated by each half circuit. Thus, the half circuits can be identical. FIG. 2A shows the full parity check matrix arranged to show the symmetry in relation to the half data words.

Another characteristic of the inventive parity code which allows for fail-safe and self-checking characteristics is that each parity check bit can be generated solely from the parity of one of the eight data nybles (UK, LK, UL, LL, UM, LM, UN and LN) and the values of the data bits in three bit position sets consisting of bit positions i, i+8, i+16, i +24 where i is equal to three numbers of the set, i=0,1, . . . 7. For example, the parity relationship in row eight of the parity check matrix in FIG. 1 can be calculated from the nyble parity of nyble UN and the parity of the data bits in data bit positions i, i+8, i+16 and i+ 24 where i=1,2, and 3. When the matrix is rearranged this characteristic is retained except that after rearranging the matrix as shown in FIG. 2A, each parity bit can be calculated from one nyble parity and the values of data bits in three bit position sets consisting of bit positions i, i+4, i+8, i+12 where i=0, , , 4.

This latter characteristic allows for internal self-checking by using some of the nyble parity bits generated as intermediate variables in the complete encoding and decoding process to form an additional code called the byte parity code. This code is not stored along with the data as is the parity check code but is instead sent along with the data when the data is transferred internally in the system. Since the byte parity code is generated by a portion of the same circuitry which generates the error checking syndromes, this circuitry can be checked by checking the byte parity codes. This is a key element in assuring the self-checking properties of the code.

A block schematic diagram of the encoder/decoder circuitry which uses the code relationships shown in FIG. 2 is shown in schematic form in FIG. 3. As shown, the encoder/decoder is composed of two identical halves 330 and 340.

The circuitry in encoder/decoder halves 330 and 340 can operate in either the encoder mode or the decoder mode. In FIG. 3, the arrows show the data flow when the circuit is used in the encoder mode. The encoder mode is used when, for example, data is being stored in a memory. In the encoding mode the circuitry generates the parity code bits to be stored along with the data bits. In addition, in the encoding mode, the byte parity bits associated with the data received by the encoding/decoding circuitry are checked for possible errors.

In the decoder mode the direction of data flow reverses from that shown in FIG. 3 and the decoder receives code parity bits and generates byte parity bits. The decoding mode is used when, for example, data is being retrieved from a memory. In the decoding mode the retrieved data bits are checked against the retrieved parity code bits to detect an error. If a correctable error is detected an interrupt signal is generated from the circuitry to inform the remainder of the computer system that a correctable error has occurred. Each half of the encoder/decoder circuitry corrects any single error occurring in the sixteen data bits provided to it and the corrected 16 data bits are provided on output buses 360 and 370. Buses 360 and 370 are combined into output bus 380 and the data thereon is provided to the remainder of the circuitry. When operating in the decoding mode the circuitry generates the byte parity bits to be sent along with the data and also generates a valid data bit which is sent along with the data. The valid data bit is used to inform external circuitry when correct and valid data is on bus 380 or when data which contains multiple errors that cannot be corrected is on bus 380.

In particular, in the encoding mode, the data word and the appended parity code word are provided to the encoder/decoder circuitry at the left side of the circuitry via bus 300. In the illustrative embodiment, each data word has 32 data bits and the appended parity code word has eight bits. Bus 300 is split so that sixteen data bits are sent, via buses 310 and 320, to each of the encoder/decoder halves 330 and 340. In addition, one half of the parity code word consisting of four bits is sent to each of decoder halves 330 and 340.

In accordance with the invention, the data and parity words are split so that the sixteen most significant data bits (i.e. the four most significant bits of each of the four bytes) and the four most significant parity code bits are sent to one of encoder/decoder halves 330 and 340 and the sixteen least significant data bits and the four least significant parity bits are sent to the other encoder/decoder half. In addition, four byte parity bits are provided to the encoder/decoder circuitry. Two of these bits are provided to each encoder/decoder half.

Each of encoder/decoder halves 330 and 340 performs calculations on the sixteen data bits and the four parity code bits received from buses 310 and 320. However, to generate the complete parity check relationships, certain information must be passed between the encoder/decoder halves 330 and 340 (via bus 350). Specifically, signals passed between the encoder/decoder halves consist of nyble parity bits which are generated as intermediate variables in the encoding/decoding processes.

A block schematic diagram of one half of the illustrative encoder/decoder is shown in FIG. 4. Since each half of the encoder/decoder contains the same circuitry, only one encoder/decoder circuit half will be discussed in detail for clarity. It is to be understood that the other half contains identical circuitry and operates in an identical manner on one half of the data bits. FIG. 4 shows the functional relationship between various major circuit components in the half decoder. The circuitry contained in each of the blocks will be explained in detail hereinafter.

The 16 data bits which are to be processed by the encoder/decoder circuit half are provided to the circuit via bus 400 which is connected to the inputs of buffer 410 and (via bus 405) to buffer 415. Buffer 415 also receives four parity code bits on bus 401 and the two byte parity bits on bus 402. Buffers 410 and 415 contain a plurality of buffer gates which provide isolation between the encoder/decoder circuitry and its inputs. They are under control of encoder/decoder control 420 by means of bus 425. Control circuit 420 can enable either buffer 410 or buffer 415 or both buffers or disable both buffers in accordance with the specific operation being performed. When the encoder/decoder operates in the encoder mode, buffer 410 is disabled and the four parity code bits received over bus 401 are forced to logical "0"s in buffer 415. Alternatively, when the encoder/decoder circuit operates in a decoder mode, buffer 410 is enabled and the two byte parity bits received over bus 402 in buffer 415 are forced to logical "0"s.

The output of buffer 410, consisting of 16 buffered data bits (a1–a16), is provided, via bus 429, to data corrector circuit 488. If the circuit is operating in the decoding mode and an error is detected by the error correction circuitry, appropriate correction signals (n1–n16) will be provided, via bus 486, to data correction circuitry 488 to cause it to correct the erroneous bit in the 16-bit data word so that the correct 16-bit data word is applied to output bus 499.

The 16 data bits buffered by buffer 415 (b1–b16) are provided, via bus 427, to first stage syndrome generator 430. In addition, four parity code bits (b17–b20) are provided to generator 430. The two byte parity bits inputs processed by buffer 415 (b21, b22) are provided, via bus 432, to the byte parity encoder/decoder circuit 482 which will be described further hereinafter.

The data and parity bit outputs provided from buffer 415 to first stage syndrome generator 430 (b1–b20) are combined by the syndrome generator circuitry to form the eight relationships shown on the left or right hand sides of FIG. 2A. Specifically, syndrome generator circuitry 430 forms the four nyble parities (outputs f1–f4) and the four other parity relationships (outputs c1–c4). Generator 430 also generates the complements of the output signals c1–c4. The complementary signals are designated as signals e1–e4. In addition, two other signals, d1, d2, are generated by generator 430. These signals are the parity of the half data word consisting of bits, b1–b16, which parity signal is designated as signal d1 and the complement of signal d1, signal d2. These latter signals are used in decoding the syndromes at a later stage as will be hereinafter explained.

As previously mentioned, the characteristics of the exclusive-OR operation used to generate the parity check relationships or syndrome bits allow the syndrome bits to be generated in pieces. However, since each of the encoder/decoder halves operates on only half of the data bits, each syndrome bit must be calculated in two pieces and then later the pieces generated in each half combined to calculate the complete syndrome bit.

In particular, referring to FIG. 2A, in order to generate each syndrome bit, a parity relationship shown on the lefthand side of FIG. 2A must be exclusive-ORed with a corresponding parity relationship shown on the righthand side of FIG. 2A and the result exclusive-ORed with the appropriate parity bit. Since the parity relationships shown on the left half of FIG. 2A are derived by one circuit half based on one half of the data bits and the parity relationships shown on the right half of FIG. 2A are derived by the other circuit half based on one half of the data bits, information must be passed between circuit halves to generate each syndrome bit. Illustratively, this information is the four nyble parities. These parity signals (f1–f4) are calculated by generator 430 and provided, via bus 434 and terminal 435 to the other half circuit.

Each circuit half combines the results of the four parity relationships computed from the data bits available to it with the four nyble parities computed by the other half circuit to generate four syndrome bits (half of the total eight-bit syndrome). This combination is performed in second stage syndrome generators 442 and 444. Generator 442 receives four bits, c1-c4, corresponding to the four computed parity relationships calculated from the input data bits via bus 438 and four nyble parities, g1-g4, received from the other circuit half over terminal 441 and bus 440. Similarly generator 444 receives the complemented parity relationship bits, e1-e4, from generator 430 over bus 437 and the nyble parity bits g1-g4 from the other decoder half. Generator 442 generates four syndrome bits, h1-h4, on bus 456 and generator 444 generates four bits, i1-i4, which are the complements of the bits generated by generator 442. The complemented bits are provided on bus 454 to be used in a later stage of processing.

The nyble parities (f1-f4) generated by generator 430 are also provided, via bus 434, to the byte parity encoder/decoder circuit 482. The operation of circuit 482 will be discussed below.

The half syndrome consisting of bits h1-h4 and its complement (bits i1-i4) are used by the first stage syndrome decoder 458 to detect syndrome bit patterns which indicate errors in the received data bits. First stage decoder 458 also receives the data word parity, d1, and its complement, d2, for use in this processing. Since each circuit half operates on only half of the data bits the entire syndrome cannot be calculated solely by each circuit. Thus decoder circuit 458 only decodes the half syndrome bits, h1-h4, provided to it. Decoder 458 generates several sets of output signals. One set of output signals, j1-j4, indicate the position of a potentially erroneous bit. However, since the half circuit does not have the complete syndrome information at this stage, the signals j1-j4 cannot specify the exact position of the erroneous bit. Instead, the signals j1-j4 indicate the modulo-4 position of a potentially erroneous bit. Specifically, if bit j1 is a logical "1", then a bit in one of the bit positions $4i+1$, $i=0,1,2,3$ may be in error; if bit j2="1" then one of bits $4i+2$, $i=0,1,2,3$ may be in error.

In addition, the first stage syndrome generator also calculates four bits, l1-l4, which indentify a byte (nyble) in the data half word processed by the other half encoder/decoder circuit which may contain a bit that is in error. For example, if bit l1="1" then byte N (consisting of nybles UN and LN) may contain an erroneous bit. Similarly, l2="1" indicates that byte M may contain an erroneous bit. Bit l3 corresponds to byte L and bit l4 corresponds to byte K. The byte pointer bits, l1-l4, are sent to the other half circuit via buses 472 and 475 and terminal 474.

The first-stage syndrome decoder also generates two signals which indicate whether any error has been detected. In particular, signals k1 and k2 identify detected errors. Signal k1="1" indicates the presence of a detected error (a non-zero syndrome) if d1="1". Signal k2="1" indicates the presence of a detected error if d2="1".

The error pointers, j1-j4, are provided to the second stage syndrome decoder, 484 via bus 468. Decoder 484 also receives the byte pointer bits, m1-m4, from the other circuit half via terminal 476, and buses 477 and 478. From these two signal sets decoder 484 has sufficient information to identify the position of an erroneous bit. Decoder 484 produces bit pointers n1-n16 which identify the position of an erroneous data bit. Specifically, if bit n1 is "1" then data bit a1 is erroneous. The erroneous bit pointers are provided to the data corrector circuit 488 via bus 486.

As previously mentioned, data corrector circuit 488 receives the buffered data bits, a1-a16, from buffer 410.

The corrector circuit uses the bit pointer signals, n1-n16, to effect a correction of the erroneous data bit. Corrected data bit signals are provided on bus 499.

The encoder circuit, 464, functions to generate the parity code word to be appended to the data before it is stored. It receives the half syndrome bits, h1-h4, and the inverse half syndrome bits, i1-i4, over buses 452 and 450 respectively. The encoder circuit also receives the data word parity signals, d1 and d2. The encoder circuit generates four output signals, s1-s4, which are the bits for one half of the parity code word. The other half of the parity code word is generated by the other half circuit.

The error condition detector 480 monitors internally generated error signals and generates two outputs, q1 and q2. The signal state q1="1" indicates that an error has been detected. If signal q2="1", then the error is either in one of the data bits belonging to the opposite half circuit or the error is in one of the parity code bits. Error condition detector 480 receives the data parity signals d1 and d2 from syndrome generator 430 over bus 466, the byte pointer signals l1-l4 over bus 483 from syndrome decoder 458 and the error signals k1 and k2 over bus 470 from decoder 458.

The byte parity encoder/decoder circuit 482 combines two nyble parity bits generated by the syndrome generator 430 with two nyble parity bits generated by the other circuit half to produce two of the four byte-parity bits. The two bytes used for calculation of the byte parity are composed of the nybles XN,YM and XL,YK. In particular, byte parity encoder/decoder circuit 482 receives nyble parity bits f1 and f3 over bus 434 from syndrome generator 430 and nyble parity, bits g2 and g4 from the other half circuit over bus 440. When the byte parity encoder/decoder circuit is checking the byte parity bits of received data, encoder/decoder 482 also receives the buffered byte parity bits b21 and b22 over bus 432 from buffer 415.

The byte parity encoder/decoder 482 generates four byte parity signals, p1-p4. Two signals, p1 and p3 are the byte parity signals and the remaining signals, p2 and p4, are the complements of these signals. Encoder/decoder 482 also generates an indicator signal, t, which indicates that the byte parity of the received data is in error.

The byte parity signals, p1-p4, are sent over bus 487 to the byte parity corrector circuit, 490. This circuit monitors the error signals to determine whether either of the two bytes associated with the circuit half contains a correctable error. If so, the erroneous bit is corrected. In particular, byte parity corrector 490 receives byte parity signals p1-p4 from the byte parity encoder/decoder 482 over bus 487. Corrector 490 also receives byte error pointers l1-l4 and m1-m4 over buses 481 and 483 and error signals q1 and q2 over bus 494. The corrected byte parity bits are generated on output lead 498.

The valid data bit generator circuit 491 monitors the error signals q1 and q2 received over bus 485 from error condition detector 480 the error signals r1 and r2 (the counterparts of signals q1 and q2) received from the other half circuit over terminal 493 and bus 496. Circuit 491 generates the valid data bit signal which is sent along with every word to indicate its validity.

Figure 5:
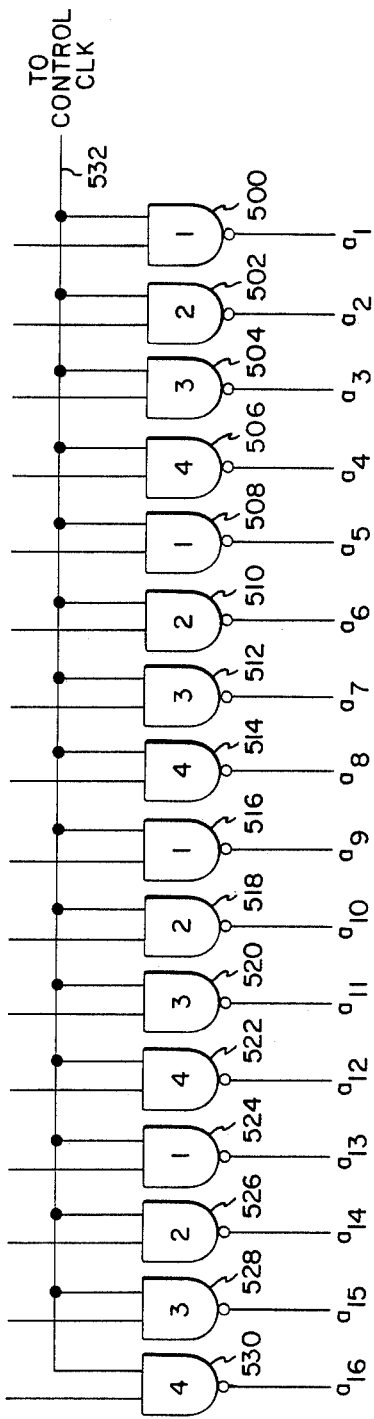
FIG. 5 is an electrical schematic diagram of the logic gate array used in one input buffer.

The detailed circuit diagrams for each of the circuit blocks shown in FIG. 4 are shown in FIGS. 5-16. In particular, the circuitry for buffers 410 and 415 is shown in detailed schematic form in FIGS. 5 and 6. Buffer 410, as shown in FIG. 5, consists of sixteen NAND gates 500-530. Each of NAND gates 500-530 has two inputs; one input receives a data bit from the data half-word assigned to that half circuit. The other input of each NAND gate is connected to encoder/decoder control circuit 420 by means of bus 425. Encoder/decoder control circuit 420 contains conventional circuitry which receives commands from the computer system and places the encoder/decoder circuit into either an encoding mode or a decoding mode. As previously mentioned, when the encoder/decoder circuitry operates in an encoding mode, buffer 410 is not used. Accordingly, control circuit 420 places a "low" signal on lead 532, disabling buffer 410. In order to preserve the fail-safe characteristics, care must be taken to minimize the possibility of failures affecting multiple bits. In particular, as shown in FIG. 5, buffer 410 is implemented with four-bit-wide integrated circuits. The gates which handle each bit are selected so that no two bits belonging to the same data nyble pass through the same integrated circuit. An illustrative arrangement of the gates in each integrated circuit is shown in FIG. 5 by the numbers in each NAND gate. Since there are sixteen NAND gates comprising buffer 410, four separate integrated circuits each with four NAND gates are used to implement the buffer. The circuits are arbitrarily assigned numbers 1 through 4. The number inside each NAND gate indicates the integrated circuit to which it belongs. If the buffer gates are illustratively arranged in the integrated circuits as shown in FIG. 5, no two bits belonging to the same nyble will pass through the same circuit.

Figure 6:
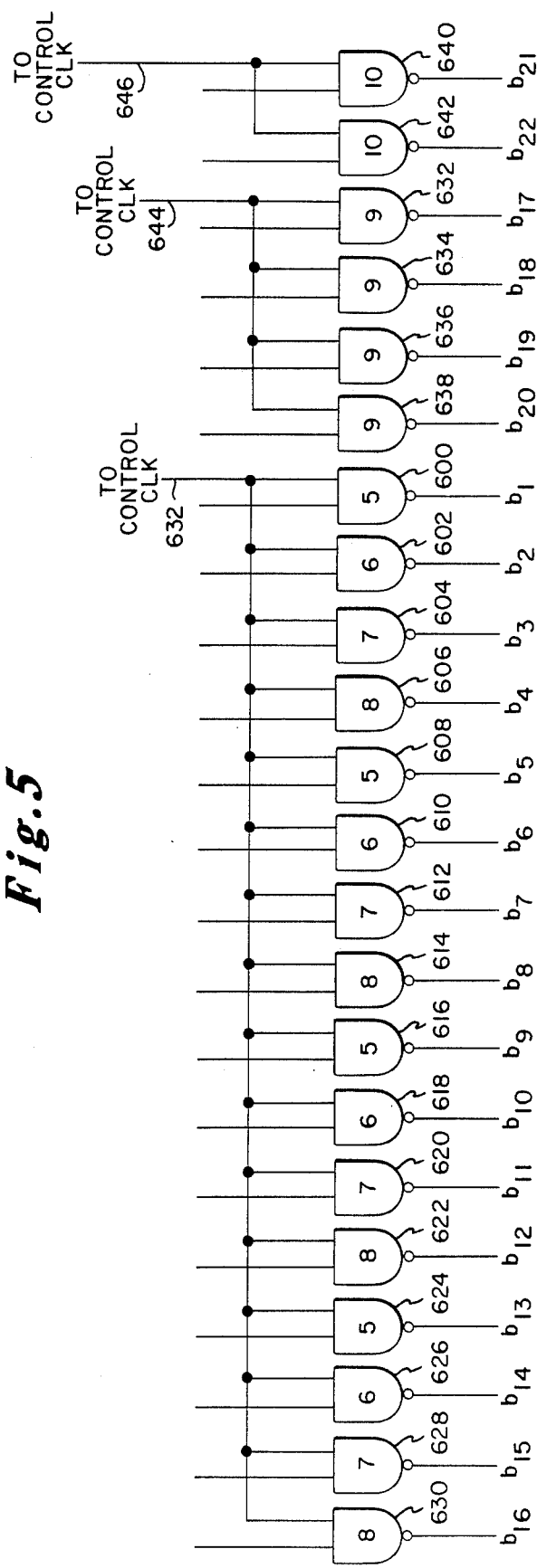
FIG. 6 is an electrical schematic diagram of a logic gate array used in a second input buffer.

FIG. 6 shows the internal arrangement of buffer 415, which is arranged in a similar fashion to buffer 410. In particular, data bits b1-b16 are buffered through sixteen NAND gates, 600-630. Each NAND gate has two inputs, one of which receives an appropriate half data-word bit; the other inputs of all NAND gates 600-630 are connected together and to the control circuit 420 via lead 632. This latter connection allows the control circuit 420 to control the connection of the encoder/decoder circuit to its inputs. As with buffer 410, the NAND gates 600-630 are arranged in such a manner so that no two bits belonging to the same data nyble pass through the same circuit. Illustratively, NAND gates from four integrated circuits are used to implement the data buffer portion of buffer 415. These circuits are identified as circuits 5-8 and the numbers in each NAND gate correspond to the circuit assignment.

The four parity code bits, b17-b20, are also buffered by NAND gates 632-638 located on a single integrated circuit (designated as integrated circuit 9). In a similar fashion, the two byte-parity bits, b21 and b22, are buffered through two NAND gates, 640 and 642, located on a separate integrated circuit designated as circuit 10. NAND gates 632-642 are also under control of control circuit 420 by means of control signals on leads 644 and 646, respectively. As previously mentioned, when the encoder/decoder circuit operates in the encoding mode, the four parity code bits are forced to logical "1" by a "low" signal on lead 644 generated by control circuit 420. In a similar fashion, when the encoder/decoder circuit operates in the decoding mode, the two byte-parity bits, b21 and b22, are forced to a logical "1" by control circuit 420 by means of a "low" signal on lead 646.

Figures 7, 8:
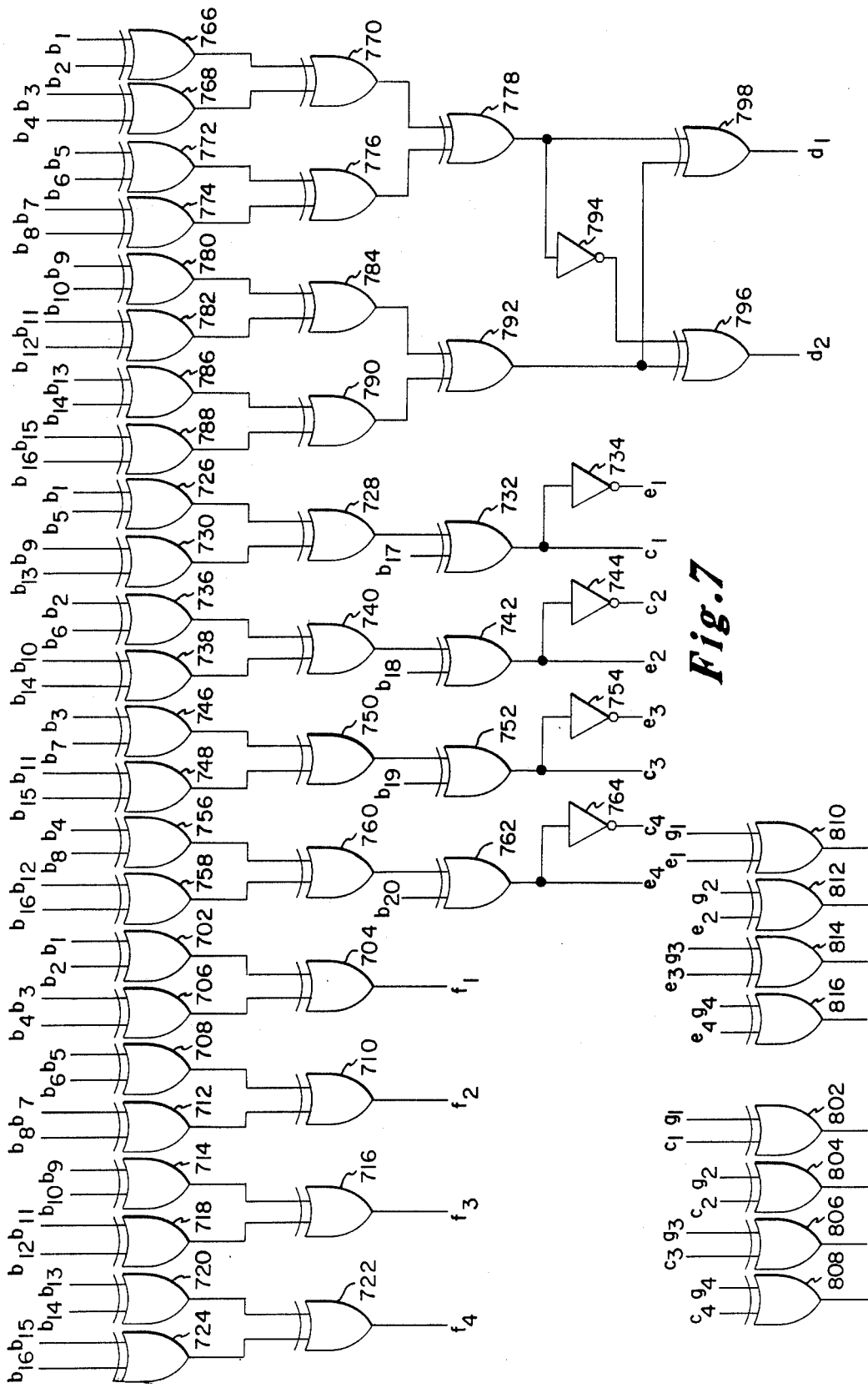
FIG. 7 is an electrical schematic diagram of logic gate connections in a first-stage syndrome generator.
FIG. 8 is an electrical schematic diagram of gate connections in a second-stage syndrome generator.

The outputs of the data buffer 415 are provided to the first stage syndrome generator 430 (FIG. 4). More specifically, as shown in FIG. 7, first stage syndrome generator 430 consists of a plurality of exclusive-OR (XOR) gates 702-798. The XOR gates are connected in groups of four to calculate parity relationships between selected incoming bits.

In particular, XOR gates 702-724 calculate the nyble parity signals, f1-f4. As shown in the upper left quadrant of FIG. 2A, the four data nybles are UK, UL, UM and UN (or LK, LL, LM and LN). These nybles are comprised of data bits b1-b4, b5-b8, b9-b12 and b13-b16, respectively. XOR gates 702-706 form the nyble parity, f1, of nyble UK. Specifically, bits b1 and b2 are XORed together by XOR gate 702. Bits b3 and b4 are XORed by gate 706. The output of XOR gates 702 and 706 is XORed by gate 704 to produce nyble parity signal f1=b1 XOR b2 XOR b3 XOR b4. XOR gates 708-712 form nyble parity f2. Similarly, nyble parities f3 and f4 are formed by gates 714-718 and 720-724 respectively.

XOR gates 726-758 generate the parity relationships shown in the lower left quadrant of FIG. 2A. One way to generate these relationships is to XOR the bit signals denoted by "1"s in each line. However, in order to simplify the circuitry, reduce the number of gates used and decrease encoding time, the parity relationships are not directly generated by XORing the bits designated in the lower left quadrant of FIG. 2A. Instead, the parity relationships are generated using the associative property of the XOR operation. Specifically, the lowest row in the lower left quadrant can be expressed in terms of the parity of the entire row as follows:

$$(b2 \; XOR \; b3 \; XOR \; b4 \; XOR \; b6 \; XOR \; b7 \; XOR \; b8 \; XOR \; b10 \; XOR \; b11$$

$$XOR \; b12 \; XOR \; b14 \; XOR \; b15 \; XOR \; b16) =$$

$$(b1 \; XOR \ldots XOR \; b16) \; XOR \; (b1 \; XOR \; b5 \; XOR \; b9 \; XOR \; b13)$$

From this relationship it can be seen that the value of the desired parity relationship can be obtained from the value of the parity of the entire data word and the parity of only bits b1, b5, b9, and b13. In particular the value of the desired relationship is equal to the parity of bits b1,b5,b9 and b13 if the parity of the entire data word is even; the value of the desired relationship is equal to the complement of the parity of bits b1,b5,b9 and b13 if the parity of the entire data word is odd.

Thus, referring to FIG. 7, the first parity relationship is generated by gates 726-732. Specifically, XOR gates 726-730 calculate the parity relationship using incoming data bits b1,b5,b9 and b13. Gate 732 XORs the result of the latter calculation with parity bit b17 to generate signal c1, an intermediate variable in the syndrome calculation. In order to provide for higher processing speeds, the complement of signal c1 is calculated by inverting signal c1 by means of inverter 734 to produce the inverted signal, e1. At a later stage in the processing, a choice will be made between the signal c1 and its inversion, e1, depending on the parity of the half data word (d1) to calculate the entire parity relationship. If d1="0", d2="1", the signals c1-c4 are "true", if d1="1", d2="0" then the signals e1-e4 are "true".

XOR gates 736-764 similarly generate the signals c2-c4 and their respective inversions, e2-e4. These signals represent the parity relationships expressed in the four rows in the lower left quadrant of FIG. 2A.

The first stage syndrome generator also generates the even and odd parities of the entire data half-word so that the proper signal of signals c1-c4 or signals e1-e4 can be selected at a later stage in processing. The even parity relationship is generated by gates 766-796. In particular, gates 766-768 correspond to gates 702-706 and generate the nyble parity f1. Gates 772-776 correspond to gates 708-712 and generate nyble parity f2. Similarly, gates 780-784 generate nyble parity f3 and gates 786-790 generate nyble parity f4. The nyble parities f1-f4 are combined by gates 778-796 to generate the parity of the entire data half-word, d1. Thus d1="0" if the data word parity is even and d1="1" if the parity is odd. Consequently, if d1="1" the parity relationships c1-c4 will be complemented values, and if d1="0" the parity relationships c1-c4 will be true values. Inverter 794 ensures that odd parity signal d2 will be the complement of even parity signal d1. (It will be noted that the outputs of gates 770, 776, 784 and 790 are identical to those of gates 704, 710, 716 and 722 respectively. The reasons for this duplication become clear in the ensuing discussion.)

The parity signals c1-c4 and e1-e4 are provided to the second stage syndrome generators 442 and 444.

The second stage syndrome generators 442 and 444 receive the parity outputs, c1-c4 and e1-e4, from the first stage syndrome generator 430 and corresponding nyble parities, g1-g4, from the other half circuit. These signals are combined in the second stage syndrome generators to produce one half of the syndrome bits. The detailed circuitry for each generator is shown in FIG. 8.

In particular, XOR gates 802-808 combine parity relationships c1-c4 with the nyble parities g1-g4 to generate the syndrome bits, h1-h4. Each bit corresponds to the parity relationship in one row of FIG. 2A or to its complement, depending on the values of the data word parity d1. Therefore, the four bits, h1-h4, correspond to the four relationships in the lower half of FIG. 2A. The values of the signals h1-h4 are dependent on the value of the signals d1 and d2 as discussed above. If d1="1" (d2="0"), then a "low" signal in any syndrome bit indicates an error in the parity relationship in the corresponding row. For example, if h1="0" then one of the bits in the lowermost row marked with a "1" in FIG. 2A is in error. By examining the four syndrome bits, h1-h4 (or their complements, i1-i4) the erroneous bit position can be narrowed down to one of four positions. For example if h1="1" and h2,h3 and h4="0" then one of bits b1, b5, b9 or b13 is erroneous because only these bits enter into the parity relationships determining the three syndrome bits, h2, h3 and h4.

In addition, XOR gates 810-816 of the second stage syndrome generator combines the complemented parity relationships, e1-e4, with the nyble parities, g1-g4, to generate the complemented syndrome bits, i1-i4.

The parity relationships h1-h4 and i1-i4 are provided to the first stage syndrome decoder 458. The first stage syndrome decoder compares the half syndrome bits received from the second stage syndrome generator to determine whether any data bit in the sixteen data bits provided to the half circuit are in error. In addition, the first stage syndrome generator also determines if any of the 16 data bits processed by the opposite half decoder are in error or if any single or multiple bit error has occurred regardless of location.

Figure 9:
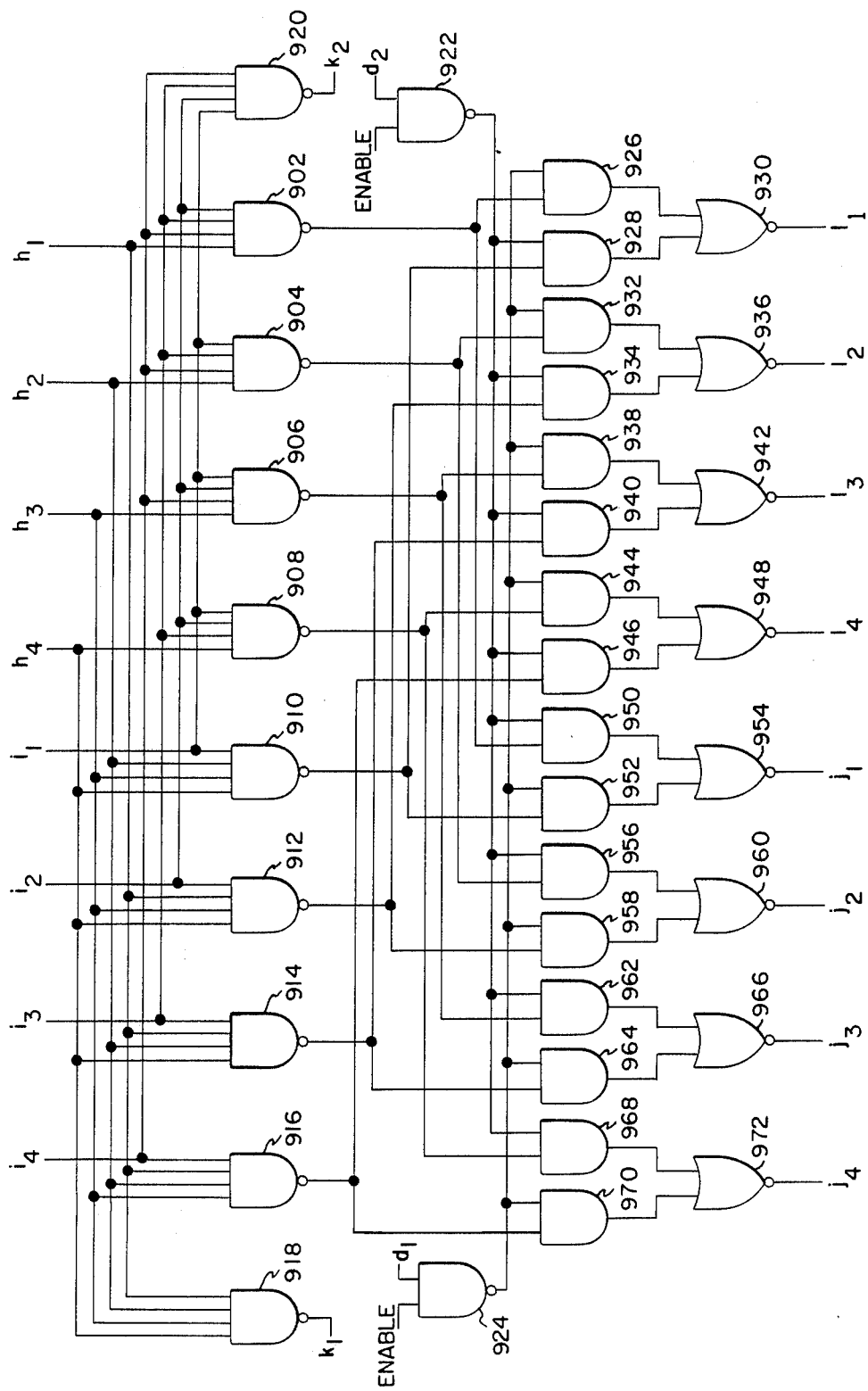
FIG. 9 is an electrical schematic diagram of logic gate connections in a first-stage syndrome decoder.

The detailed circuitry of the first stage syndrome decoder is shown in FIG. 9. The syndrome bits h1-h4 and their complements i1-i4 are provided to NAND gates 902-916. These gates check four patterns of syndrome bits to narrow the position of any erroneous bit to one of four groups. In particular, each of the four syndrome bits, h1-h4 is ANDed with the complements of the remaining three bits. For example, NAND gate 902 generates the pattern (h1)(i2)(i3)(i4) =(h1)(h2*)(h3*)(h4*) where "*" indicates inversion. This gate will produce a "low" output if an error has occurred in one of bits b1, b5, b9 and b13 because an error in one of these bits will produce the syndrome bits: h1="1", h2="0", h3="0" and h4="0".

In a like manner, NAND gates 904-908 form the three other syndrome patterns. NAND gates 910-916 form four relationships which are the inverse of the patterns formed by NAND gates 902-908. The output of NAND gates 902-908 or the outputs of NAND gates 910-916 are transferred to the syndrome decoder outputs j1-j4 depending on the values of the data parity bits d1 and d2. In particular, if d1="1", d2="0" then the outputs of gates 902-908 are selected. A "high" d1 signal is provided to NAND gate 924. Gate 924 also receives a signal over lead 923 from control circuit 420. This signal is "high" when the encoder/decoder circuit is in the decoding mode. In the decoding mode NAND gate 924 thus produces a "low" signal on its output which signal disables AND gates 970, 964, 958, 952, 944, 938, 932 and 926. A "low" d2 signal on is applied to gate 922, disabling it and causing it to apply a "high" signal to gates 928, 934, 940, 946, 950, 956, 962 and 968. These gates are enabled and transfer the outputs of gates 902-908 to NOR gates 954-972. Thus, a "low" signal at the output of one of gates 902-908 results in a "high" signal at the outputs j1-j4 of gates 954-972. In addition the outputs of gates 910-918 are transferred to gates 930-948 to generate signals l1-l4. On the other hand, if d1="0" and d2="1" then the outputs of gates 910-916 are transferred to gates 954-972 and generate the outputs j1-j4 and the outputs of gates 902-908 are transferred to gates 930-948 and generate outputs l1-l4.

Gates 918 and 920 generate the error detection bits k1 and k2. In particular, if any of the syndrome bits h1-h4 is "low", indicating that an error has been detected, gate 918 will be disabled causing a "high" signal to be produced on its output, k1. This signal is "true" if d1="1" and d2="0". In a like manner, when d1="0" and d2="1", if any of the inverted syndrome bits, i1-i4, are "low", NAND gate 920 will be enabled producing a "high" signal on its output, k2. Signals k1 and k2 are provided to the error detection circuitry 480 as will be hereinafter described.

Error pointer outputs j1-j4 are sent to the second stage syndrome decoder 478. Byte pointer bits l1-l4 are sent to the other encoder/decoder circuit half. Similarly, byte pointer outputs m1-m4 generated by identical circuitry in the other encoder/decoder circuit half are provided to the second stage syndrome decoder 484.

Figure 10:
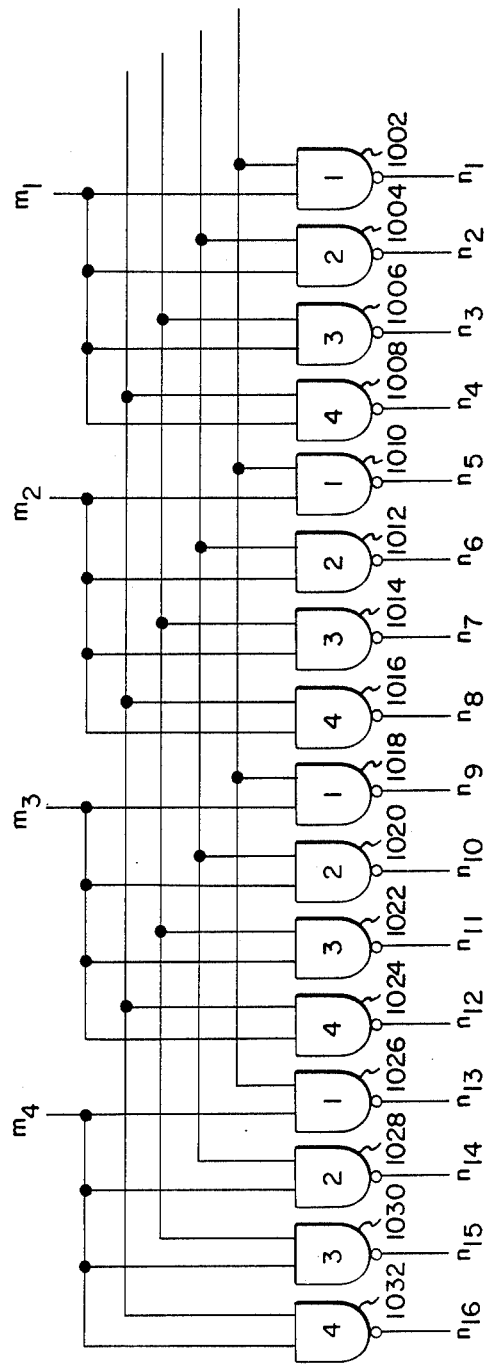
FIG. 10 is an electrical schematic diagram of logic gate connections in a second-stage syndrome decoder.

The second stage syndrome decoder 484 is shown in detail in FIG. 10 and combines the error pointer outputs j1-j4 with the byte pointer signals m1-m4 to identify the bit position of an erroneous bit, if any, in the inputs to encoder/decoder circuit half.

The second stage syndrome decoder consists of NAND gates 1002-1032. These gates act as a four-by-four decoder to combine the error pointer bits j1-j4 with the byte pointer bits m1-m4 to produce output correction signals, n1-n16. In effect the signals m1-m4 select which byte contains an error and the signals j1-j4 select the position of the erroneous bit within the selected byte. The result is a "high" signal on one of outputs n1–n16 corresponding to the position of the erroneous bit. Correction outputs n1–n16 are provided to the data correction circuit 488.

In order to contain the effect of circuit failures on the output of the second stage syndrome decoder, the circuitry is implemented so that no two outputs corresponding to bits in the same byte emanate from the same integrated circuit. Specifically, the numbers inside each of NAND gates 1002–1032 indicates the integrated circuit number to which the gate is assigned. The circuitry can be implemented with four integrated circuits, each consisting of four gates.

Figure 11:
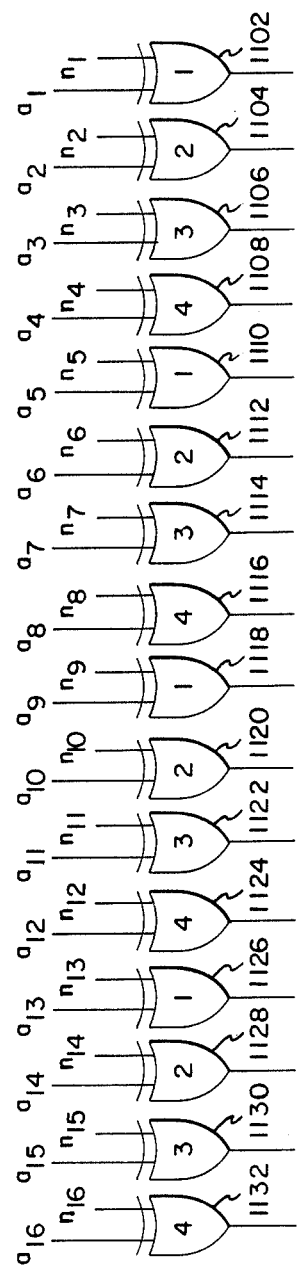
FIG. 11 is an electrical schematic diagram of logic gate connections in a data corrector circuit.

The detailed circuitry of the data corrector circuit is shown in FIG. 11 and consists of 16 exclusive-OR gates 1102–1132. Each of XOR gates 1102–1132 combines one of data bits a1–a16 with the corresponding correction signal. If the correction signal is "high" the corresponding bit is complemented to produce a corrected output which is then forwarded to bus 499. The data corrector circuit is also implemented with four integrated circuits assigned according to the numbers inside of each gate.

Figure 12:
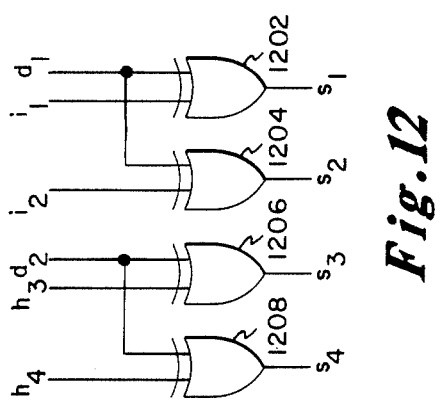
FIG. 12 is an electrical schematic diagram of logic gate connections in an encoder circuit.

FIG. 12 shows the detailed circuitry for the encoder 464. As previously mentioned, the encoder circuitry is used when information is being stored in a memory or transmitted as opposed to being read from the memory or received. The four parity code signals are generated by four exclusive-OR gates, 1202–1208. Instead of directly using syndrome bits h1–h4, a combination of bits h1–h4 and i1–i4 are used to produce four signals, two of which are "true" and two of which are "inverted". This choice allows the decoding circuitry to check the operation of both generators 442 and 444 by means of the code. Specifically, gates 1202 and 1204 process complemented syndrome bits i1 and i2 by exclusive-ORing bits i1 and i2 with data word parity bits d2 and d1, respectively. Similarly, gates 1206 and 1208 process syndrome bits h3 and h4 by exclusive-ORing them with parity bits d1 and d2, respectively. If d1="1", d2="0" then the parity code outputs, s1–s4 will be equal to i1, i2*, h3*, h4. Alternatively, if d1="0" and d2="1" then the parity code signals, s1–s4 will be equal to i1*, i2, h3, h4*.

Figure 13:
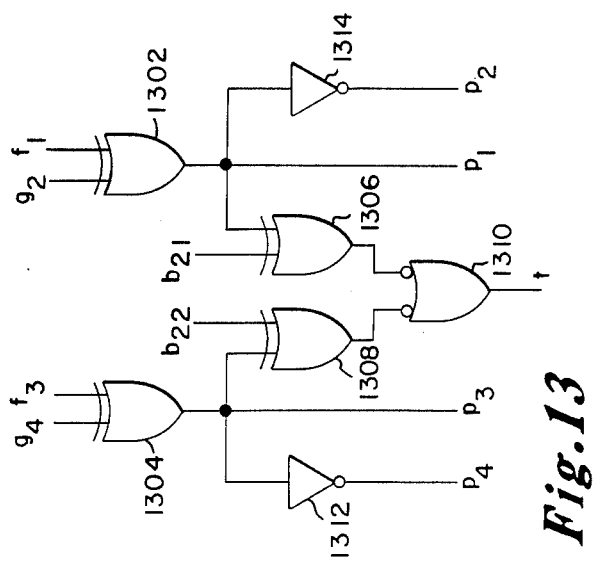
FIG. 13 is an electrical schematic diagram of logic gate connections in a byte parity encoder/decoder circuit.

The detailed circuitry of the byte parity encoder/decoder is shown in FIG. 13. The byte parity encoder/decoder combines two nyble parity bits f1 and f3 generated by the syndrome generator located in the same half encoder/decoder with the two nyble parity bits generated by the syndrome generator located in the opposite half of encoder/decoder. The combination yields two of the four byte parity bits. The bytes for which the parity signals are generated are composed of nybles XN, YM and nybles XL, YK as shown in FIG. 2. The byte parity encoder/decoder circuitry consists of four XOR gates 1302–1308, two inverters, 1312 and 1314 and one NAND gate 1310. Gates 1302 and 1304 combine the four nyble parity bits f1, f3, g2, g4 corresponding to the aforementioned nybles to calculate the byte parity outputs p1 and p3. Signal p1 is inverted by inverter 1314 to produce complemented parity signal p2. Similarly, signal p3 is inverted by inverter 1312 to produce complemented parity signal p4. If the circuit is operating in the decoding mode these bits are transmitted along with the data.

If the circuit is operating in the encoding mode, the calculated byte parities are compared against the received byte parities. This comparison is carried out by gates 1306 and 1308 which exclusive-OR calculated parity signals p1 and p3 with the complemented, received byte parity bits on leads b21 and b22. The outputs of gates 1306 and 1308 are provided to gate 1310 which generates a byte parity error indicator signal, t, for received data. Signal t is "high" if either gate 1308 or gate 1306 indicates that one of the calculated parity bits does not match the corresponding received parity bit.

The byte correction information, p1–p4, is provided to the byte parity correction circuitry. The byte parity correction circuitry monitors the error signals, q1,r1 m2, m4, l1 and l3, to determine when either of the two bytes associated with the encoder/decoder half circuit contains a correctable error. If this found to be the case, the byte parity correction circuitry complements the byte parity so that the byte parity will remain correct after the erroneous bit has been corrected by the data corrector circuitry.

Figure 14:
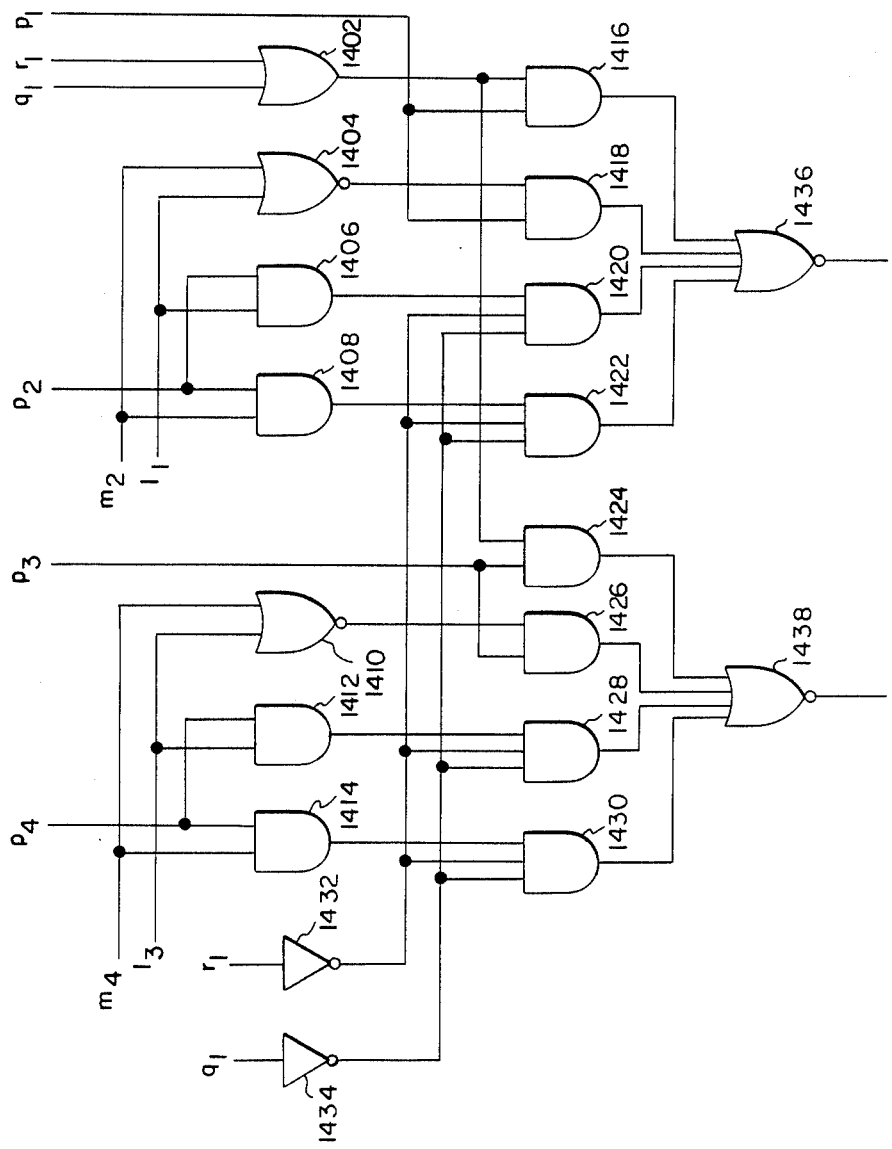
FIG. 14 is an electrical schematic diagram of logic gate connections in a byte parity corrector circuit.

The circuitry of the byte parity corrector 490 is shown in detail on FIG. 14. It consists of two identical halves, each of which generates a corrected byte parity bit. For example, the circuitry consisting of gates 1402–1408, 1416–1422 and 1436 generates the byte parity for the byte consisting of the nyble generated by the local half decoder and the nyble generated on the opposite half decoder. The calculated byte parity (p1) should be complemented only if both decoder halves detect some error (in which case signals q1 and r1 are both "low") and either the local decoder half detects an error in the nyble associated with the opposite decoder half (in which case signal l1 is "high") or the opposite decoder half detects an error in the "local" nyble (in which case signal m2 is "high"). If either of these two situations occur, an error has been identified as occurring in a data bit of the byte in question. This is so because if a single bit error is identified by one decoder half as belonging to the nyble associated with the opposite decoder halve, but the error is not detected by the opposite decoder half, then the error must be due to a code parity error. Accordingly, no data bit is in error and the calculated bit parity should not be complemented.

The gate logic in the righthand half of FIG. 14 implements the above error-checking conditions. In particular, as shown in the righthand side of FIG. 14, the parity bit p1 and its complement p2 are combined with the signals q1, r1, l1 and m2 to generate the output parity bit at gate 1436. Gate 1436 actually complements the output bit, but for the purposes of this discussion this fact will be temporarily ignored.

In the situation where both decoder halves detect some error (q1 and r1 both "low") then the signal q1 will be inverted by inverter 1434 to produce a "high" signal which "high" enables gates 1422 and 1420. Similarly, the "low" r1 signal will be inverted by inverter 1432 to enable gates 1422 and 1420. Gates 1422 and 1420 are provided with the output of gates 1408 and 1406, respectively. These gates detect the condition where either of signals m2 or l1 is "high". This situation occurs when either the opposite decoder half detects an error in the "local" nyble N (signal m2 "high") or the local decoder half detects an error in the opposite decoder half nyble M (signal l1 "high"). Thus, if one of these two situations occurs either gate 1406 or gate 1408 will be enabled, allowing the complemented parity signal p2 to pass through to enabled gates 1422 or 1420 to output gate 1436.

Alternatively, if either of the error signals q1 or r1 is "high", then gates 1420 and 1422 will be disabled. However, gate 1402, which receives these latter error signals at its inputs, will produce a "high" signal enabling gate 1416 which will then pass the complemented byte parity bit p1 to the output gate 1436. Similarly, if either signal l1 or signal m2 is "low", gate 1404 will produce a "high" output enabling gate 1418 which thereupon passes the uncomplemented byte parity signal p1.

The left half of the circuitry shown in FIG. 14 operates in a similar manner on the byte parity bit p3 and its complement, p4. As with the right half of the circuitry, byte parity bit p3 should be complemented only if both decoder halves indicate an error (q1 and r1 both "low") and either the local decoder half detects an error in opposite half decoder nyble K (signal l3 "high") or the opposite decoder half detects and error in the local nyble L (signal m4 "high"). If either of these conditions occurs, then the complemented byte parity bit p4 is passed through to the output gate 1438. Otherwise, the uncomplemented bit parity byte p3 passes through one of gates 1424 or 1426 to the output gate 1438.

Figure 15:
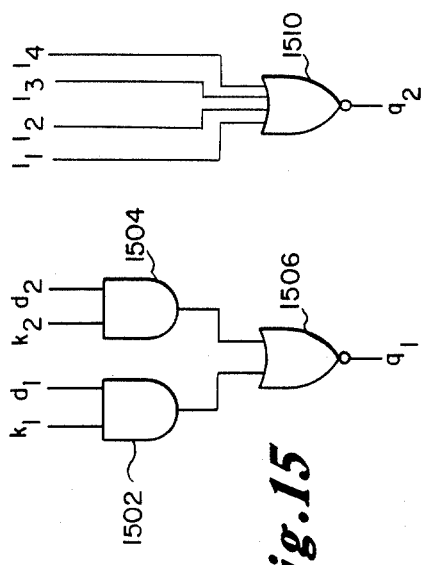
FIG. 15 is an electrical schematic diagram of logic gate connections in an error condition detector circuit.

The q1 and q2 signals which, respectfully, indicate that an error has been detected in the local and opposite decoder halves are generated by the circuitry shown in FIG. 15 and, particularly, on the lefthand side of FIG. 15.

In particular, gates 1502 and 1504 receive the data parity bits d1 and d2 and the error detection bits k1 and k2 generated by the first stage syndrome decoder circuitry shown in FIG. 9. As explained previously in connection with FIG. 9, a "high" k1 signal indicates that an error has been detected (if the data parity byte d1 is "high" and the data parity byte d2 is "low"). In this condition AND gate 1502 will be enabled (due to the "high" error bit k1 and the data parity bit d1 being "high"). Gate 1502 will thereupon produce a "high" signal which, in turn, causes NOR gate 1506 to produce a "low" signal on the q1 output indicating that an error has occurred. Alternatively, a true signal on the k2 error bit (signal k2 "high") and the data parity bit d2 "high" will enable gate 1504 causing gate 1506 to, in turn, generate a "low" error signal q1.

Gate 1510 generates an output signal which indicates that one of the data bits belonging to the opposite decoder half contains an error or there is an error in one of the parity check bits. The q2 signal is generated by gate 1510 from the l1-l4. These signals point to the byte that contains an error in a data bit belonging to the opposite decoder half. If any of the l signals is "high", the q2 signal becomes "low", indicating an error in the opposite decoder half.

Figure 16:
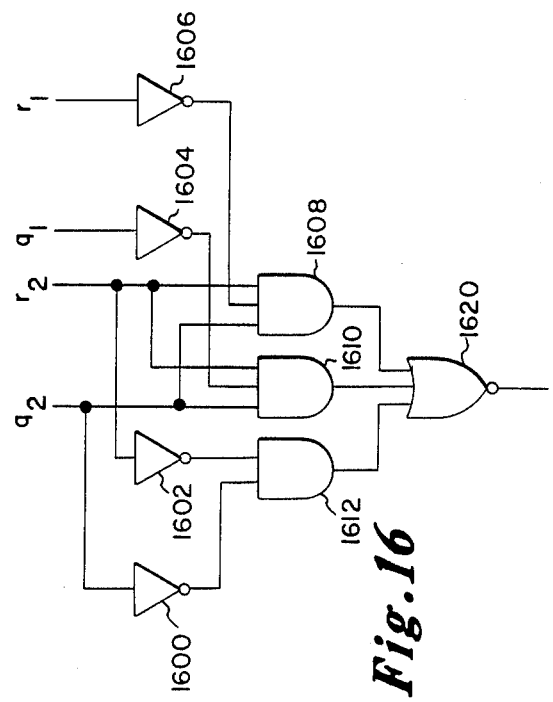
FIG. 16 is an electrical schematic diagram of logic gate connections in the circuitry which generates a valid data bit signal when the data is valid.

The remaining circuitry shown in FIG. 16 is the valid data bit generator. The valid data bit generator circuitry consists of gates 1600-1620. Gate 1620 produces a "high" signal if the output data bits are valid, that is, if the retrieved data and associated parity check bits contained at most one error (which would have been corrected). Gate 1620 will produce a "low" output signal if an uncorrectable error situation occurs. An uncorrectable error condition results in three cases. The first case occurs where both decoder halves detect an error on the opposite decoder half (signals q2 and r2 both "low"). The second condition occurs if an error is detected, but neither decoder half identifies it as an error belonging to the other half (signals q2 and r2 both "high" and either signal q1 or signal r1 "low").

The third condition occurs if an error is identified by decoder half as belonging to the opposite decoder half but the error detected by the opposite decoder half is not identified with either half.

The first two non-correctable error conditions result in a "low" output signal produced by the circuitry shown in FIG. 16. In particular, under the first condition where both decoder halves detect an error on the opposite decoder half signals q2 and r2 will both be "low". These "low" signals will be inverted by inverter 1600 and 1602 and applied to AND gate 1612 enabling the gate to produce a "high" signal at its output. This "high" signal will be provided to NOR gate 1620 causing it to produce a "low" signal at its output indicating that an uncorrectable error condition has occurred.

Similarly, in the case where an error has been detected but neither decoder half identifies it as an error belonging to the other half, the signals q2 and r2 will be "high" enabling AND gates 1610 and 1608. If either of the signals q1 or r1 is "low", inverters 1604 and 1606 will produce a "high" signal, respectively enabling either AND gate 1608 or AND gate 1610 to produce a "high" signal. This "high" signal, in turn, causes NOR gate 1620 to produce a "low" output indicating an uncorrectable error condition.

The third uncorrectable error condition will result in an erroneous bit parity byte. Since signals q1 and r1 will both be "low", in accordance with the circuitry shown in FIG. 14 and discussed above, one of the byte parity bits will be complemented even though no data bit is complemented. Thus, in all cases the uncorrectable error results in either a "low" data valid signal or and at least one invalid bit parity byte.

With the above described circuit construction, all failures which cause data to be erroneously modified during a decoding operation are guaranteed either to cause the valid-data bit signal to be inhibited or to produce at least one erroneous byte parity bit thus ensuring that the error will be instantaneously detectable at the destination. Any decoder failure not resulting in erroneously modified data, nevertheless results in either one or more byte parity errors, an inhibited data-valid bit, or an interrupt due to some detected error condition which can be used to initiate a diagnostic routine.

Error detection will occur even when the first manifestation of the failure occurs during an encoding operation even if the consequently improperly encoded data is subsequently retrieved and decoded using the same failed component. Moreover, failure detection is not dependent on the type of failure mode. The circuit retains both fail-safe and self-checking properties regardless of any failure, whatsoever, affecting any component used to implement the encoder/decoder circuitry. For example, if an integrated circuit fails, it is not reasonable to assume that the failure affects only one output or that the affected outputs are, as a result of the failure, permanently driven to a particular state, such as a logical "0" or a logical "1". In addition, it is not realistic to assume that only outputs are affected. An integrated circuit may fail in such a way that it affects both inputs and outputs in non-predictable ways. However, regardless of the manner of failure, the above circuitry will provide an error indication.

The following Table I indicates the manner of detecting various failures and components in this circuitry which are manifest on a decoding operation. The last column indicates additional notes which are applicable to each condition. These notes follow tables I and II.

TABLE I

| | Faults first made manifest on a read | | | |
|---|---|---|---|---|
| Failed component Location | Failure Mode | No. of erroneous output data bits | Detection Mechanism | Notes |
| Buffer A or B | Same single bit error in both A & B outputs | None | Correctable error interrupt | Note 1 |
| | Single bit-error on B output; other than an identical error on the A output | Up to four | One or more byte-parity violations | Note 2 |
| | No errors on B output; one or more A output errors | Up to four | One or more byte parity violations | Note 2 |
| | Multiple bit errors on B output; arbitrary A output errors | Up to four | One or more byte parity violations | Notes 2 & 3 |
| 1st-stage syndrome generator | Arbitrary failure mode with zero, two or four nyble-parity errors | None | Correctable error interrupt or inhibited valid-data bit | Note 4 |
| | Arbitrary failure mode with 1 or 3 nyble parity errors | None, one or four | One or three byte parity errors; correctable error interrupt or inhibited valid data bit | Notes 4 & 6 |
| 2nd stage syndrome generator | Arbitrary | None | Correctable error interrupt or inhibited valid-data bit | Note 5 |
| 1st stage syndrome decoder | Arbitrary | None | Correctable error-inter or inhibited valid data bit | Note 5 |
| 2nd stage syndrome decoder | Arbitrary | Up to four | Up to 4 byte parity errors | Note 2 |
| Data corrector | Arbitrary | Up to four | Up to 4 byte parity errors | Note 2 |
| Encoder | Arbitrary | None | Correctable error interrupt or inhibited valid data-bit | Note 5 |
| Byte parity encoder | Arbitrary but with signals d1 & d2 not both forced active | None | Possible byte parity error; correctable error interrupt or inhibited valid-data bit | Note 5 & 7 |
| | Arbitrary but forcing 2 or four nyble-parity errors (f1, g2, f3, g4) | None | Possible byte parity error; inhibited valid-data bit | Notes 5 & 7 |
| | Arbitrary but with signals d1, & d2 both forced active and with 1 nyble parity error (f1, f3) | Four | At least 2 byte parity errors; inhibited valid-data bit | Note 6 |
| Error condition detector | Arbitrary | None | Up to 2 byte parity errors; correctable error interrupt or inhibited valid-data bit | Note 5 |
| Byte parity corrector | Arbitrary | None | Up to 2 byte parity errors; possibly inhibited |  |

TABLE I-continued

| | | Faults first made manifest on a read | | |
|---|---|---|---|---|
| Failed component Location | Failure Mode | No. of erroneous output data bits | Detection Mechanism | Notes |
| Valid data bit generator | Arbitrary | None | valid-data bit Possible correctable error interrupt or inhibited valid-data bit | Note 5 |

The following Table II indicates the manner of detecting various failures and components in this circuitry which are manifest on an encoding operation. The last column indicates additional notes which are applicable to each condition. Theses notes follow Table II.

TABLE II

| Failed Component Location | Failure Mode | Detection Mechanism | Notes |
|---|---|---|---|
| Buffer B | Arbitrary | Byte-parity error interrupt | Note 2 |
| 1st stage syndrome | Arbitrary failure mode affecting only 2nd stage syndrome generator inputs | Correctable error interrupt or an inhibited valid-data bit on a read | Notes 6 & 8 |
| | All other failure modes | Byte-parity-error interrupts | |
| 2nd stage syndrome | Failure mode not affecting the nyble-parity inputs from the opposite decoder half | Correctable-error interrupt or inhibited valid-data bit on a read | Note 9 |
| | All other failure modes | Byte-parity error interrupt | |
| Encoder | Failure modes either not affecting or complementing both of the inputs from the 1st-stage syndrome generator | Correctable-error interrupt or inhibited valid-data bit on a read | Note 9 |
| | All other failure modes | Byte-parity error interrupt | |

Notes applicable to the foregoing Tables I and II.
1. This condition is equivalent to the case in which the memory output contains a single-bit error; the decoder corrects the error and initiates an interrupt to announce that event.
2. Buffers A and B, the second-stage syndrome decoder and the data corrector are all so partitioned that no two bits belonging to the same byte have any component in common. Thus, no single-component failure in these elements can affect more than one bit in any one byte, (Buffer A is not used on writes, since no error correction is attempted in this case.)
3. The code has the property that all multiple-bit errors affecting only bits separated by integer multiples of eight bits are recognized as uncorrectable.
4. No data bits will be "corrected" unless the half syndrome calculated in the non-defective half of the decoder contains either one or three logical "1"s. Since it is assumed that the decoder input contains no errors and that only one of the decoder halves contains a defective component, no data bits will be altered unless either one or three of the nyble-parity bits (f1, f2, f3, f4 in FIG. 4) passed from the defective to the non-defective half are in error.
5. Correctable error interrupts will occur without any data bits actually being corrected when the decoder determines that a single code parity bit is in error.
6. The first stage syndrome generator outputs e1–e4 are normally the complements of outputs c1–c4, and data half-word parity output, d1, is normally the complement of output d2. A single-component failure can alter at most one of these relationships. Thus, if the first-stage syndrome decoder is functioning properly, none of the signals j1–j4 can be active unless either signals d1 and k1, are both "1" or d2 and k2 are both "1". Consequently, the byte-parity corrector circuits are all also functioning and no data "error" can be corrected without also causing a byte-parity bit to be complemented; if the byte parity was in error prior to the "correction", it remains in error afterwards as well. Since, under the aforementioned conditions, no correction can take place unless at least one of the nyble-parity bits (f1, f2, f3, f4) is in error, data modifications caused by a first-stage syndrome generator malfunction must leave at least one byte-parity bit in error. (This is true even when the failure leaves d1 and d2 both "1", thereby allowing the possibility that four data bits are simultaneously modified. In this event all four byte parities will also be complemented and three will be left in error, regardless of whether the correction takes place in the defective or in the non-defective half of the decoder.)
7. Since the byte parity encoder can affect only two outgoing nyble-parity bits (signals f1, and f3 in FIG. 4) and two incoming nyble-parity bits (signals g2, g4), it can not by itself force a correctable error syndrome (a syndrome having three logical "1"s from one decoder half and one logical "1" from the other half). If it forces both d1, and d2 to "1", however, and forces exactly one error in the outgoing nyble parity bits, it will cause four bits to be complemented in the byte corresponding to the erroneous nyble parity. However, this will also cause the two byte parities in the opposite half decoder to be complemented (according to Note 5) thus creating at least two byte parity errors and preventing the valid data bit from being set, regardless of the output of the defective byte parity encoder.
8. Since first-stage syndrome generator failures can affect at most one pair of outputs c1–c4 and outputs e1–e4 (according to Note 6), such failures can alter at most one code parity bit. Since the corresponding syndrome bit is calculated (on decoding operations) using the same defective component, it may or may not be correct depending both on the failure mode and on the data pattern. If the failure is such that the calculated syndrome bit is "0" regardless of the data pattern, no error will be detected on a read unless a bit error is actually present either because of some other failure or due to a diagnostic test. The effect of such a failure, however, is to convert a correctable data error syndrome into an uncorrectable one (i.e. to change a syndrome having four logical "1"s to one having three logical "1"s), thus inhibiting the valid data bit. If the failure is such that the calculated syndrome bit is either always a "1" or is pattern sensitive, the effect is to convert an all "0"s syndrome into a syndrome identifying a parity bit as being in error (i.e. into a syndrome having exactly one logic "1"). In neither case is incorrect data ever produced.
9. Second-stage syndrome generators A and B each affect only two code bits, but neither of them can by itself determine all four half-syndrome bits. Thus, failures in either one of these units are detected on reads in which the other is used. Similarly, the encoder can affect only outputs h1 and h2 from buffer A and outputs i3 and i4 from buffer B. Yet an error in one of the encoder outputs s1–s4 affects both second-stage syndrome generator bits h1–h4 and i1–i4 when the improperly encoded word is read so encoder failures are also detected on subsequent reads.

What is claimed is:
1. Apparatus for encoding digital data for storage or transmission, said data being comprised of at least one data word having a plurality of bits, said apparatus comprising, means for dividing the bits of said data word into a first bit group and a second bit group, each group consisting of a portion of the total number of data bits, syndrome generator means comprising two identical syndrome generator circuits, each of said syndrome generator circuits comprising a first stage syndrome generator circuit responsive to data bits in one of said bit groups for generating an intermediate syndrome signal, and a second stage syndrome generator circuit responsive to the intermediate syndrome signals from the first stage syndrome generator circuits in both of said syndrome generator circuits for generating a set of parity check signals, and means for appending said parity check signals to said first and second data bit groups.

2. Encoding apparatus according to claim 1 further comprising means for combining said first and second data bit groups and said appended parity check signals to form a data word for transmission or storage.

3. Encoding apparatus according to claim 1 wherein said first stage syndrome generator circuit is responsive to said data bits for generating a plurality of true intermediate syndrome signals, a plurality of complemented intermediate syndrome signals and a plurality of nyble parity relationships.

4. Encoding apparatus according to claim 3 wherein said second stage syndrome generator circuit comprises means responsive to said true intermediate syndrome signals, said complemented intermediate syndrome signals and to said nyble parity signals generated by the other syndrome generator circuit for generating complemented parity signals.

5. Encoding apparatus according to claim 4 wherein said second stage syndrome generator circuit comprises two identical half circuits, a first half circuit being responsive to said true intermediate syndrome signals and to said nyble parity signals generated by the other syndrome generator circuit for generating true parity signals and a second half circuit being responsive to said complemented intermediate syndrome signals and to said nyble parity signals generated by the other syndrome generator circuit for generating complemented parity signals.

6. Encoding apparatus according to claim 5 wherein said second stage syndrome generator circuit further comprises an encoder circuit responsive to said true parity signals and to said complemented parity signals for generating parity check signals.

7. Apparatus for encoding digital data for storage or transmission, said data being comprised of at least one data word having a plurality of bits, said apparatus comprising, means for dividing the bits of said data word into a first bit group and a second bit group, each group consisting of one-half of the total number of data bits, a first encoder half circuit responsive to the data bits in said first bit group for generating a first set of parity relationships from the values of the data bits in said first group, a second encoder half circuit responsive to the data bits in said second bit group for generating a second set of parity relationships from the values of the data bits in said second group, parity generator means for deriving parity check signals from selected ones of said first and second sets, and means for appending said parity check signals to said first and second data bit groups.

8. Encoding apparatus according to claim 7 further comprising means for combining said first and second data bit groups and said appended parity check signals to form a data word for transmission or storage.

9. Encoding apparatus according to claim 7 wherein said first encoder half circuit and said second encoder half circuit are comprised of identical circuitry.

10. Encoding apparatus according to claim 7 wherein said first parity relationship set comprises a third subset of parity relations and a fourth subset of parity relations and said second parity relationship set comprises a fifth subset of parity relations and a sixth subset of parity relations.

11. Encoding apparatus according to claim 10 wherein said third subset and said fifth subset are derived using identical parity equations and said fourth subset and said sixth subset are derived using identical parity equations.

12. Encoding apparatus according to claim 11 wherein said parity generator means comprises two identical syndrome generator circuits, a first syndrome generator circuit generating a first set of syndrome signals and a second syndrome generator circuit generating a second set of syndrome signals.

13. Encoding apparatus according to claim 12 wherein said first set of syndrome signals are derived from said third and sixth subsets and said second set of syndrome signals are derived from said fourth and fifth subsets.

14. Encoding apparatus according to claim 13 wherein said first set of parity relationships comprises a plurality of true parity relationships and a plurality of complemented parity relationships and wherein said first syndrome generator circuit comprises two identical half circuits, a first half circuit being responsive to said true parity relationships for generating true syndrome signals.

15. Encoding apparatus according to claim 14 wherein said first syndrome generator circuit comprises a second half circuit being responsive to said complemented parity relationships for generating complemented syndrome signals.

16. Encoding apparatus according to claim 15 wherein said parity generator means further comprises encoder means responsive to said true syndrome signals and said complemented syndrome signals for generating said parity check signals.

17. Apparatus for decoding digital data after retrieval from storage or after transmission, said data being comprised of at least one data word having a plurality of data bits and a plurality of parity check bits appended to said data bits, said apparatus comprising, means for dividing the bits of said data word into a first bit group and a second bit group, each group consisting of a poriton of the total number of data bits, means for dividing the parity check bits of said data word into a first parity check bit group and a second parity check bit group, each parity check bit group consisting of a portion of the total number of parity check bits, syndrome generator means comprising two identical generator half circuits, each of said generator half circuits comprising means responsive to said data bits in one of said groups and to said parity check bits in one of said groups for deriving parity check signals, syndrome decoder means comprising two identical decoder half circuits, each of said half circuits comprising a first stage decoder circuit responsive to selected parity check signals for generating intermediate data correction signals, and a second stage decoder responsive to intermediate data correction signals generated by the first stage decoder circuits in each decoder half circuit for generating erroneous bit pointers, and data correction means responsive to said data bits in said data word and to said erroreous bit pointers for generating corrected data bits.

18. Apparatus for decoding digital data after retrieval from storage or after transmission, said data being comprised of at least one data word having a plurality of data bits and a plurality of parity check bits appended to said data bits, said apparatus comprising, means for dividing the bits of said data word into a first bit group and a second bit group, each group consisting of one-half of the total number of data bits, means for dividing the parity check bits of said data word into a first parity check bit group and a second parity check bit group, each parity check bit group consisting of one-half of the total number of parity check bits, a first decoder half circuit responsive to the data bits in said first data bit group and to the parity check bits in said first parity check bit group for generating a first set of parity relationships from the values of the data bits in said first data bit group and the values of said parity check bits in said first parity check bit group, a second decoder half circuit responsive to the data bits in said second data bit group and to the parity check bits in said second parity check bit group for generating a second set of parity relationships from the values of the data bits in said second data bit group and the values of said parity check bits in said second parity check bit group, syndrome generator means for deriving parity check signals from selected ones of said first and second sets, syndrome decoder means responsive to said parity check signals for generating data correction signals, and data correction means responsive to said said data bits in said data word and to said data correction signals for generating corrected data bits.

19. Decoding apparatus according to claim 18 wherein said first decoder half circuit and said second decoder half circuit are comprised of identical circuitry.

20. Decoding apparatus according to claim 19 wherein said first parity relationship set comprises a third subset of parity relations and a fourth subset of parity relations and said second parity relationship set comprises a fifth subset of parity relations and a sixth subset of parity relations.

21. Decoding apparatus according to claim 20 wherein said third subset and said fifth subset are derived using identical parity equations and said fourth subset and said sixth subset are derived using identical parity equations.

22. Decoding apparatus according to claim 21 wherein said syndrome generator means comprises two identical syndrome generator circuits, a first syndrome generator circuit generating a first set of syndrome signals and a second syndrome generator circuit generating a second set of syndrome signals.

23. Decoding apparatus according to claim 22 wherein said first set of syndrome signals are derived from said third and sixth subsets and said second set of syndrome signals are derived from said fourth and fifth subsets.

24. Decoding apparatus according to claim 23 wherein said first set of parity relationships comprises a plurality of true parity relationships and a plurality of complemented parity relationships and wherein said first syndrome generator circuit comprises two identical half circuits, a first half circuit being responsive to said true parity relationships for generating true syndrome signals.

25. Decoding apparatus according to claim 24 wherein said first syndrome generator circuit comprises a second half circuit being responsive to said complemented parity relationships for generating complemented syndrome signals.

26. Decoding apparatus according to claim 25 wherein said syndrome decoder means comprises two identical half decoders, each of said half decoder circuits being responsive to one half of said parity check bits for generating one half of said data correction signals.

27. Decoding apparatus according to claim 26 wherein each of said half decoder circuits is comprised of a first stage syndrome decoder and a second stage syndrome decoder, said first stage syndrome decoder being responsive to one half of said parity check bits for generating a set of intermediate syndrome signals, and said second stage syndrome decoder being responsive to intermediate syndrome signals generated by first stage syndrome generators in both of said half decoder circuits for generating one half of said data correction signals.

28. Apparatus for encoding digital data for storage or transmission, said data being comprised of at least one data word having a plurality of bits, said apparatus comprising, means for dividing the bits of said data word into a first bit group and a second bit group, each group consisting of a portion of the total number of data bits, means for dividing the bits of said first bit group into a first plurality of nybles, each of said first plurality of nybles consisting of a portion of the bits in said bit group, means for dividing the bits of said second bit group into a second plurality of nybles, each of said second plurality of nybles consisting of a portion of the bits in said bit group, nyble parity encoder means comprising two identical nyble parity circuits, one of said nyble parity circuits responsive to nyble bits in said first plurality of nybles for generating a set of nyble parities from said nyble bits, the other of said nyble parity circuits being responsive to nyble bits in said second plurality of nybles for generating a set of nyble parities from said nyble bits, byte parity encoder means responsive to selected ones of said nyble parities for generating a plurality of byte parity bits, and means for appending said byte parity bits to said first and second data bit groups.

* * * * *